US008262921B2

(12) United States Patent
Nishimura

(10) Patent No.: US 8,262,921 B2
(45) Date of Patent: Sep. 11, 2012

(54) SUBSTRATE PROCESSING METHOD, SUBSTRATE PROCESSING APPARATUS AND RECORDING MEDIUM

(75) Inventor: Eiichi Nishimura, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 931 days.

(21) Appl. No.: 12/276,781

(22) Filed: Nov. 24, 2008

(65) Prior Publication Data

US 2009/0179003 A1    Jul. 16, 2009

Related U.S. Application Data

(60) Provisional application No. 61/034,514, filed on Mar. 7, 2008.

(30) Foreign Application Priority Data

Jan. 11, 2008  (JP) ................. 2008-004951

(51) Int. Cl.
C23F 1/00       (2006.01)
C23F 1/08       (2006.01)
(52) U.S. Cl. .............. 216/41; 216/13; 438/725
(58) Field of Classification Search .......... 216/41, 216/13; 438/725
See application file for complete search history.

(56) References Cited

U.S. PATENT DOCUMENTS

| 6,764,552 B1* | 7/2004 | Joyce et al. ............. 134/3 |
| 2007/0054496 A1* | 3/2007 | Paduraru et al. ............. 438/725 |
| 2008/0057728 A1 | 3/2008 | Shimura et al. |
| 2008/0132078 A1 | 6/2008 | Yamazaki |

FOREIGN PATENT DOCUMENTS

| JP | 2006-49798 | 2/2006 |
| JP | 2006-73722 | 3/2006 |
| JP | 2006-111740 | 4/2006 |
| JP | 2007-502543 | 2/2007 |
| JP | 2007-128981 | 5/2007 |
| WO | WO 2005/017983 A2 | 2/2005 |

* cited by examiner

Primary Examiner — Nadine G Norton
Assistant Examiner — Mahmoud Dahimene
(74) Attorney, Agent, or Firm — Oblon, Spivak, McClelland, Maier & Neustadt, L.L.P.

(57) ABSTRACT

An ashing process in which an etching mask is removed through ashing by supplying hydrogen radicals toward a wafer W being heated to a predetermined temperature and a restoration process in which the film quality of a low dielectric constant insulating film having been damaged during an etching process is restored while, at the same time, rendering the low dielectric constant insulating film exposed at a recessed portion into a hydrophobic state by supplying a gas containing a β-diketone compound with an ignition point equal to or higher than 300° C. toward the wafer W having undergone the ashing process, are executed.

3 Claims, 11 Drawing Sheets

SUBSTRATE PROCESSING METHOD, SUBSTRATE PROCESSING APPARATUS AND RECORDING MEDIUM

CROSS-REFERENCE TO RELATED APPLICATIONS

This document claims priority to Japanese Patent Application Number 2008-004951, filed on Jan. 11, 2008 and U.S. Provisional Application No. 61/034,514, filed on Mar. 7, 2008, the entire content of which are hereby incorporated by reference.

FIELD OF THE INVENTION

The present invention relates to a substrate processing method, a substrate processing apparatus and a recording medium, which may be adopted when continuously executing specific processes on a substrate such as a semiconductor wafer or an FPD glass substrate.

BACKGROUND OF THE INVENTION

As an increasingly higher extent of integration is achieved in semiconductor integrated circuits in recent years, semiconductor devices need to adopt a multilayer wiring structure allowing wirings to be stacked over many layers. A semiconductor device adopting a multilayer wiring structure needs to include trench wiring that connects various elements laid out along the horizontal direction and via-hole wiring that connects various elements layered along the vertical direction. A low-resistance metal with an outstanding anti-electromigration property, such as copper, is often used as the wiring material and a highly porous low-k material that assures a low dielectric constant, is often used as the interlayer insulating material so as to achieve higher speed in the integrated circuit.

A wiring structure constituted with a low-dielectric constant insulating film (hereafter may be referred to as a "low-k film") and a copper wiring such as that described above, may be formed as described below through, for instance, the damascene method. First, an insulating film is formed on a semiconductor wafer (hereafter may be referred to as a "wafer") which is the processing target substrate and a wiring layer is formed by burying a copper wiring in the insulating film. Next, an etching stopper film, an interlayer insulating film constituted of a low-k material, a capping film and an anti-reflection coating are formed in this order over the wiring layer. Then, a photoresist film with a specific pattern corresponding to the wiring pattern is formed over the anti-reflection coating by using a photolithography technology. The photoresist film is used as a mask while etching through the anti-reflection coating, the capping film, the low-k film and the etching stopper film. As a result, a groove (trench) or a hole (via) to be used as a wiring recess is formed at the low-k film, with the surface of the copper wiring exposed at the bottom of the wiring groove or the wiring hole.

Next, the wafer undergoes an ashing process to remove the photoresist film and the anti-reflection coating. Subsequently, a wiring metal, e.g., copper, is embedded in the wiring groove or the wiring hole formed at the low-k film, and finally, any excess metal is removed through chemical-mechanical polishing (CMP). Part of the multilayer wiring structure is completed by thus connecting the horizontal copper wiring (wiring layer) with the vertical copper wiring.

The low-k film, which has become an indispensable element in a multilayer wiring structure as described above, tends to be readily damaged during the etching process or the ashing process. An area of the low-k film subjected to such damage readily absorbs water and, as a result, the dielectric constant over the area increases, resulting in an increase in the parasitic capacity between the wirings, which, in turn, may lead to a signal delay and compromise the electrical characteristics such as the insulation resistance. For this reason, a restoration process for restoring the film quality by repairing the damaged area of the low-k film or by rendering the low-k film hydrophobic is executed on the wafer having undergone the ashing process in the related art (see, for instance, patent reference literatures 1 and 2 listed below.

Today, a substrate processing apparatus equipped with a processing chamber where wafers undergo a specific type of processing must assure higher throughput, miniaturization, efficient space utilization and the like by continuously executing a plurality of types of processing within a single processing chamber. This requirement is addressed in substrate processing apparatuses that execute the ashing process and the restoration process as described above and substrate processing apparatuses capable of executing the ashing process and the restoration process within a single processing chamber have been proposed. For instance, patent reference literature 1 discloses a technology whereby after a wafer undergoes the etching process in a processing chamber, the wafer is ashed with oxygen radicals with the wafer temperature sustained at approximately 100° C.~150° C. and then a restoration process is executed on the ashed wafer by using a gas (hereafter referred to as a "silylating gas") containing a silylating agent such as TMSDMA (dimethylaminotrimethyl silane) or DMS-DMA (dimethylsilyldimethylamine) without transferring the wafer into another processing chamber.

It is also known that when the ashing process is executed with oxygen radicals, the low-k film may become damaged to result in a very significant increase in its dielectric constant. Accordingly, the use of hydrogen radicals instead of oxygen radicals in the ashing process has been proposed in recent years (see patent reference literatures 3 through 5 listed below). An ashing process is normally executed with hydrogen radicals by setting the wafer temperature to a higher level (e.g., 250° C.~400° C.) compared to the wafer temperature set for an ashing process executed with oxygen radicals. While the amount of damage to the low-k film is reduced through the use of hydrogen radicals, damage still occurs during the etching process. For this reason, it is desirable to execute a restoration process after the ashing process executed with hydrogen radicals.

However, the silylating gas used in the restoration processing in the related art tends to ignite at a relatively low temperature. For instance, the ignition point (explosion limit temperature) of TMSDMA is approximately 220° C. This means that the silylating gas may ignite as the silylating gas to be use in the restoration process is delivered into the processing chamber if the temperature of the wafer having undergone the ashing process in the same processing chamber is high.

The ashing process with oxygen radicals is executed with the wafer temperature set to a lower level (e.g., 100° C.~150° C.) than the ignition point of the silylating gas (220° C. in the case of TMSDMA, for instance). Thus, the silylating gas delivered into the same processing chamber following the ashing process so as to immediately execute the restoration process in the processing chamber, is not likely to ignite.

Hydrogen radical processing, which is executed on the wafer sustaining a higher temperature (e.g., 250° C.~400° C.) than the wafer temperature set for the oxygen radical processing, is more problematic in that a silylating gas with a low ignition point (e.g., 220° C.) delivered into the same processing chamber for the restoration process following the hydrogen radical processing is highly likely to ignite.

In short, the restoration process in the related art, executed by using a silylating gas with a low ignition point, cannot be executed in the same processing chamber where the ashing process has been executed with hydrogen radicals. Since this requires allocation of separate processing chambers for the ashing process and the restoration process in, for instance, a cluster-type substrate processing apparatus equipped with a plurality of processing chambers, miniaturization of the substrate processing apparatus and effective utilization of space have been hindered. There is an added concern that if a failure occurs in either the ashing process chamber or the restoration process chamber, continuous wafer transfer will be disabled.

(Patent reference literature 1) Japanese Laid Open Patent Publication No. 2006-049798
(Patent reference literature 2) Japanese Laid Open Patent Publication No. 2006-111740
(Patent reference literature 3) Japanese Laid Open Patent Publication No. 2006-073722
(Patent reference literature 4) Japanese Laid Open Patent Publication No. 2007-128981
(Patent reference literature 5) Japanese Laid Open Patent Publication No. 2007-502543

SUMMARY OF THE INVENTION

Accordingly, an object of the present invention, having been completed by addressing the issues discussed above, is to provide a substrate processing method and the like, which allow the restoration process to be executed immediately within the same processing chamber following an ashing process executed with hydrogen radicals.

The inventor of the present invention et al. found it of significant interest that the ignition points of many gases containing a β-diketone compound often used when forming a metal film in the related art are higher, at 300° C. or more, than the ignition temperatures of the silylating gases used in the related art. Tests conducted by the inventor of the present invention et al. revealed that a gas containing a β-diketone compound can be used in a restoration process executed to restore an area damaged during the etching process or the like. Furthermore, since such a gas, unlike the silylating gas used in the related art, normally does not contain ammonia radicals, ammonia salt, which would settle onto the processing target substrate as particles, is not readily formed on the processing target substrate. In addition, the damaged area is dehydrated more effectively with the gas containing a β-diketone compound than with the silylating gas in the related art. Based upon these findings indicating advantages of the use of a gas containing a β-diketone compound in the restoration processing, the inventor of the present invention conceived the present invention, which allows the ashing process executed with hydrogen radicals and the restoration process, requiring separate processing chambers in the related art, to be executed in a single processing chamber through the use of a gas containing a β-diketone compound with an ignition point of 300° C. or higher in the restoration process.

The object described above is achieved in an aspect of the present invention by providing a substrate processing method adopted when executing a specific type of processing on a processing target substrate that includes a low dielectric constant insulating film, an etching mask formed on the low dielectric constant insulating film and a recessed portion formed by etching with the etching mask the low dielectric constant insulating film, comprising an ashing process step in which the etching mask is removed through ashing with hydrogen radicals delivered to the processing target substrate, heated to sustain a predetermined temperature and a restoration process step in which the low dielectric constant insulating film exposed at the recessed portion is rendered hydrophobic and the film quality of the low dielectric constant insulating film having been damaged in the etching process is restored with a gas containing a β-diketone compound with an ignition point thereof equal to or higher than 300° C., delivered to the processing target substrate having undergone the ashing process.

The object described above is also achieved in another aspect of the present invention by providing a computer-readable recording medium having recorded therein a program that enables a computer to execute various steps of a substrate processing method adopted when executing a specific type of processing on a processing target substrate that includes a low dielectric constant insulating film, an etching mask formed on the low dielectric constant insulating film and a recessed portion formed by etching with the etching mask the low dielectric constant insulating film. The program enables the computer to execute an ashing process step in which the etching mask is removed through ashing with hydrogen radicals delivered to the processing target substrate, heated to sustain a predetermined temperature and a restoration process step in which the low dielectric constant insulating film exposed at the recessed portion is rendered hydrophobic and the film quality of the low dielectric constant insulating film having been damaged in the etching process is restored with a gas containing a β-diketone compound with an ignition point thereof equal to or higher than 300° C., delivered to the processing target substrate having undergone the ashing process.

According to the present invention described above, a gas containing a β-diketone compound with an ignition point of 300° C. or higher, i.e., higher than the ignition points of the gases used in the related art, is used in the restoration process. Thus, following the ashing process executed with hydrogen radicals on the processing target substrate sustained at a relatively high temperature, the restoration process can be successively executed within the same processing chamber. As long as the temperature of the processing target substrate following the ashing process is sufficiently lower than the ignition point, the restoration process can be executed by using the β-diketone compound-containing gas immediately afterwards. Thus, a great improvement in throughput over the related art, in which the different types of processing must be executed in separate processing chambers, is achieved. It is to be noted that depending upon the processing conditions, the temperature of the processing target substrate immediately after the ashing process may be higher than the ignition point. However, even under such circumstances, the restoration process can be executed with the β-diketone compound-containing gas after allowing the processing target substrate to cool down to a temperature lower than the ignition point. In this case, too, only a short wait time is required following the ashing process before the restoration process can be executed, since the ignition point of the gas used in the restoration process according to the present invention is 300° C. or higher, which is higher than the ignition points of the gases used in the related art. As a result, the throughput is not lowered significantly.

In addition, the film quality of the damaged area of the low dielectric constant insulating film, having become damaged during the etching process, is restored to a desirable condition and the damaged area can be dehydrated more readily and effectively compared to the related art.

It is desirable that the ashing process and the restoration process be executed in a single processing chamber, so as to eliminate the need to allocate separate processing chambers for the ashing process and the restoration process. Through these measures, miniaturization and more efficient utilization of space are achieved for the substrate processing apparatus.

According to the present invention, the temperature of the processing target substrate may be measured following the ashing process step, the restoration process may be executed immediately afterwards as long as the measured temperature of the processing target substrate is lower than a predetermined temperature set within a range lower than the ignition point of the gas used in the restoration process, but the restoration process may be executed only after the processing target substrate is cooled to a temperature lower than the predetermined temperature if the measured temperature of the processing target substrate is equal to or higher than the predetermined temperature. Through these measures, it is ensured that even when the temperature of the processing target substrate following the ashing process is higher than the ignition point, the processing target substrate is allowed to cool down to a temperature sufficiently lower than the ignition point. Since the length of wait time to elapse before the restoration process is executed is minimized through the temperature monitoring, better throughput is achieved.

The β-diketone compound may be, for instance, dipivaloylmethane (DPM) or acetylacetone. The ignition point of dipivaloylmethane is approximately 300° C., whereas the ignition point of acetylacetone is approximately 350° C. Namely, either gas with a much higher ignition point compared to the silylating gases used in the related art, can be used in the restoration process according to the present invention to assume significant advantages. In addition, unlike the silylating gases containing ammonia groups used in the related art, neither gas contains an ammonia group and thus neither gas readily forms ammonium salt, which would settle as particles on the processing target substrate. Moreover, either gas is highly effective in restoring the damaged area and induces a desirable dehydrating reaction to dehydrate the damaged area more effectively than the silylating gases used in the related art.

The object described above is further achieved in yet another aspect of the present invention by providing a substrate processing apparatus equipped with a processing chamber where a specific type of processing is executed on a processing target substrate that includes a low dielectric constant insulating film, an etching mask formed on the low dielectric constant insulating film and a recessed portion formed by etching with the etching mask the low dielectric constant insulating film. The processing chamber comprises a plasma generation chamber where hydrogen plasma is generated, a main processing chamber communicating with the plasma generation chamber, a stage disposed within the main processing chamber, upon which the processing target substrate is placed, a temperature adjustment unit that adjusts the temperature of the processing target substrate placed on the stage to a predetermined temperature, a hydrogen-containing gas supply unit that supplies a hydrogen-containing gas into the plasma generation chamber, an induction field forming unit that forms within the plasma generation chamber an induction field used to generate the hydrogen plasma, a β-diketone compound-containing gas supply unit that supplies a β-diketone compound-containing gas that contains a β-diketone compound with an ignition point equal to or higher than 300° C., toward the surface of the processing target substrate placed on the stage, and a exhaust device that evacuates the processing chamber.

According to the present invention described above, the ashing process executed with hydrogen radicals on the processing target substrate having undergone the etching process, and the restoration process can be executed immediately within the same processing chamber. Namely, the processing target substrate placed on the stage within the main processing chamber is heated to a specific temperature via the temperature adjustment unit. Then, as the hydrogen-containing gas is supplied from the hydrogen-containing gas supply unit into the plasma generation chamber, the processing chamber is evacuated and with the pressure inside the processing chamber thus sustained at a predetermined level, plasma is generated by forming an induction field via the induction field forming unit. The processing target substrate on the stage is ashed with hydrogen radicals generated from the plasma. Subsequently, the β-diketone compound-containing gas is supplied from the β-diketone compound-containing gas supply unit, and with the β-diketone compound-containing gas thus supplied, the restoration process is executed to restore the film quality of the low dielectric constant insulating film having been damaged during the etching process or the like while, at the same time, rendering hydrophobic the low dielectric constant insulating film exposed at the recessed portion.

The temperature adjustment unit may include a cooling unit that cools the processing target substrate placed on the stage and a heating unit that heats the processing target substrate placed on the stage. With such a temperature adjustment unit, the processing target substrate can be heated quickly for the ashing process and the processing target substrate can also be cooled quickly prior to the restoration process if the processing target substrate temperature is too high. As a result, an improvement in throughput is achieved when the ashing process and the restoration process are executed continuously.

The present invention provides a substrate processing method and the like, which, through the use of a gas with an ignition point higher than those of the gases used in the related art for the restoration process, allow the restoration process to be executed immediately within the same processing chamber after an ashing process executed with hydrogen radicals at a relatively high temperature.

DETAILED DESCRIPTION OF THE PREFERRED EMBODIMENT

Figure 1:
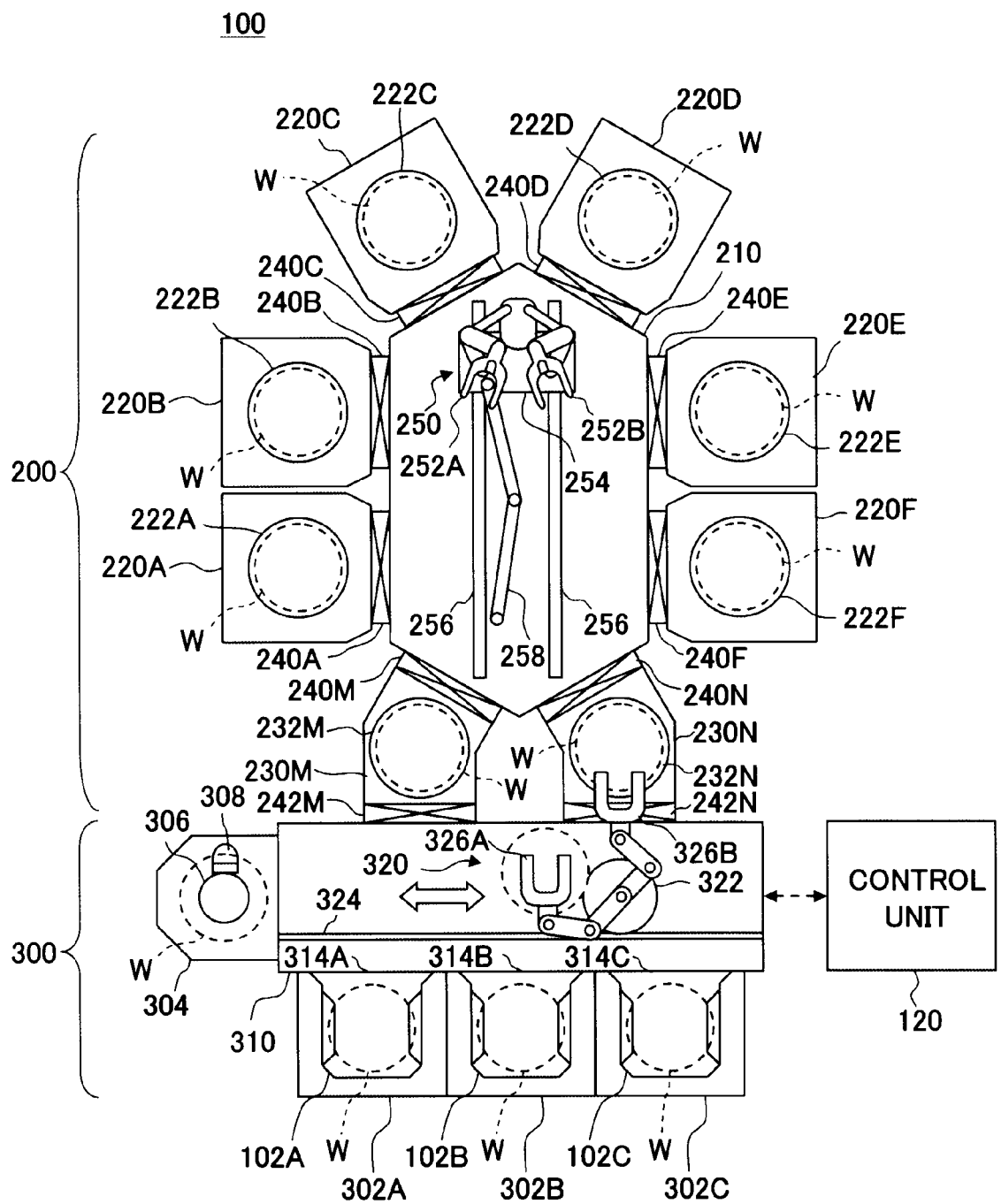
FIG. 1 is a lateral sectional view presenting an example of a structure that may be adopted in the substrate processing apparatus achieved in an embodiment of the present invention.

The following is a detailed description of a preferred embodiment of the present invention, given in reference to the attached drawings. It is to be noted that in the description and the drawings, the same reference numerals are assigned to components assuming substantially identical functions and structural features, so as to preclude the necessity for a repeated explanation thereof.

(Structural Example for the Substrate Processing Apparatus)

The substrate processing apparatus achieved in the embodiment of the present invention is explained first in reference to the drawings. FIG. 1 schematically illustrates the structure adopted in the substrate processing apparatus achieved in the embodiment of the present invention. The substrate processing apparatus 100 comprises a processing unit 200 equipped with a plurality of processing chambers where various types of processing such as an etching process, an ashing process and processing for restoring a film having been damaged during the etching process and the ashing process to a desirable condition (hereafter also referred to as a "restoration process") are executed on substrates such as semiconductor wafers W in a low pressure environment, an atmospheric pressure-side transfer unit 300 via which a wafer W is carried into/out of the processing unit 200 and a control unit 120 that executes overall control for the operations executed in the substrate processing apparatus 100.

The transfer unit 300 includes an atmospheric pressure-side transfer chamber 310 via which the wafer W is transferred between a substrate storage container such as a cassette container 102 (102A~102C) and the processing unit 200. The transfer chamber 310 is formed in a box shape with a substantially polygonal section. A plurality of cassette stages 302 (302A~302C) are set next to one another along one of the side surfaces of the transfer chamber 310 ranging along the longer side of its substantially polygonal section. The cassette containers 102A~102C can be placed respectively upon the cassette stages 302A~302C.

At each of the cassette containers 102 (102A~102C), up to, for instance, 25 wafers W, with their ends held by a holding portion, are stacked over multiple levels with a uniform pitch for storage. The cassette containers have a sealed structure that allows the inner spaces to be filled with, for instance, nitrogen (N2) gas. At the side surface of the transfer chamber 310, along which the plurality of cassette stages 302 (302A~302C) are disposed side-by-side, transfer ports 314 (314A~314C) are formed and wafers W can thus be transferred between the individual cassette containers 102 (102A~102C) and the transfer chamber 310 via the transfer ports 314 (314A~314C). It is to be noted that the numbers of the cassette stages 302 and the cassette containers 102 in the substrate processing apparatus are not limited to the examples presented in FIG. 1.

At an end of the transfer chamber 310, i.e., at a side surface of the transfer chamber ranging along the shorter side of its substantially polygonal section, an orienter (pre-alignment stage) 304 to function as a positioning device, which includes a rotary stage 306 and an optical sensor 308 for optically detecting the edge of a wafer W, both provided as built-in units, is located. The orienter 304 positions the wafer W by detecting, for instance, an orientation flat or a notch at the wafer W.

Inside the transfer chamber 310, a transfer unit-side transfer mechanism 320 which transfers the wafer W along the lengthwise direction (indicated by the arrow in FIG. 1) is disposed. A base 322 to which the transfer unit-side transfer mechanism 320 is fixed is slidably supported on a guide rail 324 laid along the lengthwise direction inside the transfer chamber 310. A mover and a stator of a linear motor are respectively disposed at the base 322 and the guide rail 324. At an end of the guide rail 324, a linear motor drive mechanism (not shown) via which the linear motor is driven is disposed. As the linear motor drive mechanism is controlled based upon a control signal sent by the control unit 120, the transfer unit-side transfer mechanism 320 moves along the lengthwise direction on the guide rail 324 together with the base 322.

The transfer unit-side transfer mechanism 320 adopts a double arm structure, which includes two arm units. In addition, the arm units are articulated, which allows them to extend, retract, move up/down and swing freely to the sides. End effectors 326A and 326B used to hold wafers W are mounted at the front ends of the arms and thus, the transfer unit-side transfer mechanism 320 is able to handle two wafers W at once. Via this transfer unit-side transfer mechanism 320, wafers W can be carried into/out of, for instance, the cassette containers 102, the orienter 304, and first and second loadlock chambers 230M and 230N to be detailed later so as to replace a wafer W present in the chamber with a new wafer W. A sensor (not shown) capable of detecting the presence of a wafer W held thereat is mounted at each of the end effectors 326A and 326B of the transfer unit-side transfer mechanism 320. It is to be noted that the number of arm units in the transfer unit-side transfer mechanism 320 is not limited to that described above and the transfer unit-side transfer mechanism 320 may adopt, for instance, a single arm structure that includes a single arm unit, instead.

Next, a structural example that may be adopted in the processing unit 200 is described. The processing unit 200 in the cluster tool-type processing apparatus 100 in the embodiment includes a common transfer chamber 210 formed to have a polygonal (e.g., a hexagonal) section, a plurality of processing chambers 220 (first through sixth processing chambers 220A~220F) connected around the common transfer chamber while sustaining air tightness and the first and second loadlock chambers 230M and 230N as shown in FIG. 1.

In the processing chambers 220A~220F, a specific single type of processing or specific different types of processing, e.g., an ashing process and a restoration process to be detailed later as well as etching, are executed on wafers W based upon process recipes and the like stored in advance in a storage medium or the like in the control unit 120. Stages 222 (222A~222F) upon which wafers W are placed are respectively disposed inside the individual processing chambers 220 (220A~220F). The structures adopted in the individual processing chambers 220 are to be detailed later. It is to be noted that the number of processing chambers 220 is not limited to that shown in FIG. 1.

The common transfer chamber 210 adopts a structure that allows its internal space to be controlled to maintain a specific degree of vacuum. Via the common transfer chamber, wafers W are carried to be transferred among the individual processing chambers 220A~220F and also from the individual chambers 220A~220F to the first and second loadlock chambers 230M and 230N. The common transfer chamber 210 is formed in a polygonal shape (e.g., a hexagonal shape), with the processing chambers 220 (220A~220F) connected around the common transfer chamber via gate valves 240 (240A~240F) respectively, with the front ends of the first and second loadlock chambers 230M and 230N also connected around the common transfer chamber via gate valves (low pressure-side gate valves) 240M and 240N respectively. The base ends of the first and second loadlock chambers 230M and 230N are connected to the other side surface of the transfer chamber 310 ranging along the longer side of the substantially polygonal section, respectively via gate valves (atmospheric pressure-side gate valves) 242M and 242N.

The first and second loadlock chambers 230M and 230N have a function of temporarily holding wafers W and passing them on to the next process upon completing pressure adjustment. Inside the first and second loadlock chambers 230M and 230N, transfer stages 232M and 232N upon which wafers W can be placed are respectively disposed.

Inside the common transfer chamber 210, a processing unit-side transfer mechanism 250 constituted with articulated arms capable of extending, retracting, moving up/down and swinging to the sides are disposed. The processing unit-side transfer mechanism 250 includes two end effectors 252A and 252B, which enable it to handle two wafers W at once. In addition, the processing unit-side transfer mechanism 250 is rotatably supported at a base 254. The base 254 slides freely on a guide rail 256 laid out to range from the base end side toward the front end side inside the common transfer chamber 210 via, for instance, a slide-drive motor (not shown). It is to be noted that a flexible arm 258, through which the wiring for, for instance, an arm swinging motor and the like passes is connected to the base 254. The processing unit-side transfer mechanism 250 structured as described above is able to access the first and second loadlock chambers 230M and 230N and the individual processing chambers 220A~220F by sliding along the guide rail 256.

For instance, the processing unit-side transfer mechanism 250 should be positioned toward the base end side in the common transfer chamber 210 along the guide rail 256 in order to access the first or second loadlock chamber 230M or 230N or either of the processing chambers 220A and 220F facing opposite each other. In order to access any of the four processing chambers 220B~220E, the processing unit-side transfer mechanism 250 should be positioned toward the front end side of the common transfer chamber 210 along the guide rail 256. Thus, all the processing chambers 220A~220F and both the first loadlock chamber 230M and the second loadlock chamber 230N, each connected to the common transfer chamber 210, can be accessed via a single processing unit-side transfer mechanism 250.

It is to be noted that the processing unit-side transfer mechanism 250 may adopt a structure other than that described above and may include, for instance, two transfer mechanisms. Namely, a first transfer mechanism constituted with an articulated arm capable of extending, retracting, moving up/down and swinging to the sides may be disposed toward the base end side of the common transfer mechanism 210 and a second transfer mechanism constituted with an articulated arm capable of extending, retracting, moving up/down and swinging to the sides may be disposed toward the front end side of the common transfer chamber 210. In addition, the number of end effectors in the processing unit-side transfer mechanism 250 does not need to be two and the processing unit-side transfer mechanism may instead include a single end effector.

(Structural Example for the Control Unit)

Figure 2:
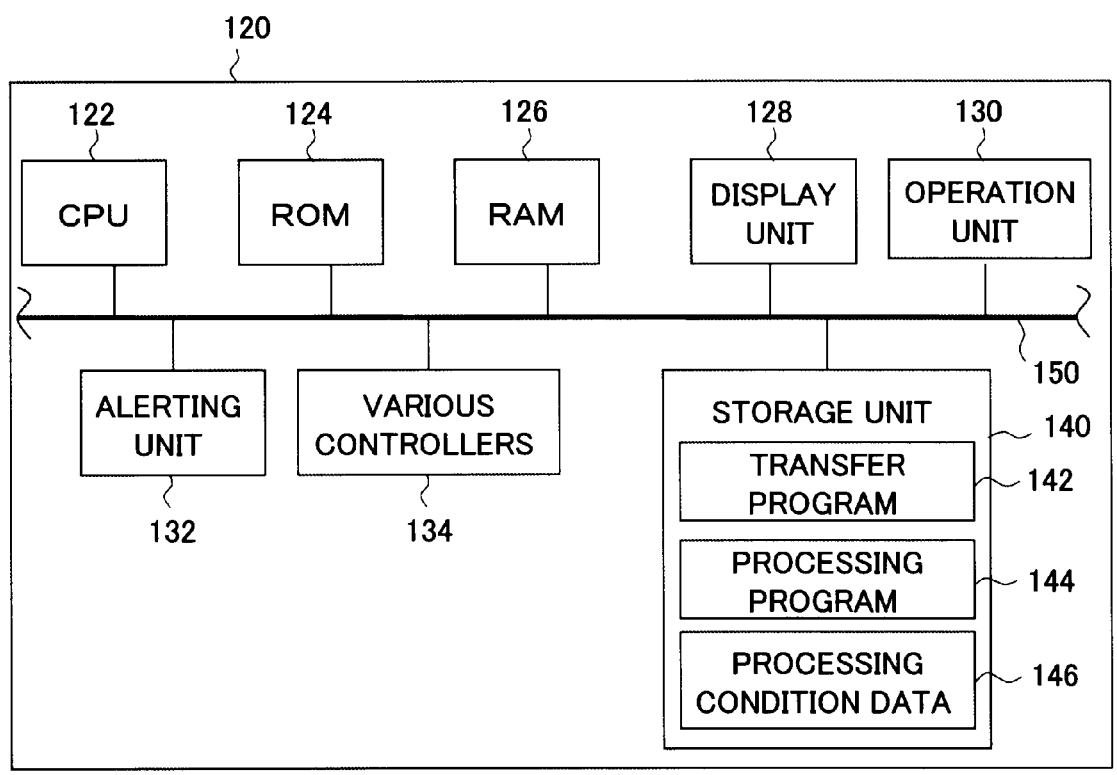
FIG. 2 is a block diagram presenting an example of a structure that may be adopted in the control unit in FIG. 1.

Next, a specific structural example that may be adopted in the control unit 120 is described in reference to a drawing. FIG. 2 is a block diagram showing the structure adopted in the control unit 120. As explained earlier, the control unit 120 controls the overall operations executed in the substrate processing apparatus 100, such as wafer processing control under which wafers W are processed in the individual processing chambers 220, displacement control for the transfer unit-side transfer mechanism 320 and the processing unit-side transfer mechanism 250, open/close control for the various gate valves 240 and 242 and rotation control for the rotary stage 306 at the orienter 304.

The control unit 120 that executes such control includes a CPU (central processing unit) 120 constituting the main body of the control unit, a ROM (read-only memory) 124 in which data and the like used by the CPU 122 to control the individual units are stored, a RAM (random-access memory) 126 having a memory area used for various types of data processing executed by the CPU 122 and the like, a display unit 128 constituted with a liquid crystal display or the like, at which operation screens, selection screens and the like are brought up on display, an operation unit (input/output unit) 130 via which the operator is able to input/output various types of data, an alerting unit 132 constituted with an alarm device such as a buzzer, various controllers 134 functioning as module controllers that individually control specific module units such as the processing chambers 220A~220F, the common transfer chamber 210, the atmospheric pressure-side transfer chamber 310 and the orienter 304 in the substrate processing apparatus 100, and a storage unit 140 for storing program data constituting various programs used in the substrate processing apparatus 100 and various types of setting information used when program processing is executed based upon the program data.

In the storage unit 140, a transfer program 142, based upon which the operations of the transfer unit-side transfer mechanism 320 and the processing unit-side transfer mechanism 250 are controlled, and a processing program 144 executed when processing wafers W in the processing chambers 220 are stored. In addition, process recipe data 146 indicating processing conditions, e.g., the chamber internal pressures, the gas flow rates, the high frequency power levels and the like, under which the processing is to be executed in the individual processing chambers 220 are stored in the storage unit 140. The data stored in the storage unit 140, which may be constituted with a recording medium such as a flash memory, a hard disk or a CD-ROM, are read out by the CPU 122 as necessary.

The CPU 122, the ROM 124, the RAM 126, the display unit 128, the operation unit 130, the alerting unit 132, the various controllers 134 and the storage unit 140 constituting the control unit 120 are electrically connected with one another via a bus line 150 which may be a control bus, a system bus or a data bus.

(Structural Examples for the Processing Chambers)

Next, structural examples that may be adopted in the processing chambers of the substrate processing apparatus 100 shown in FIG. 1 are described. The substrate processing apparatus 100 may adopt a structure that allows an etching process through which a low-k film formed on the wafer W is selectively etched in a specific pattern and post processes, i.e., an ashing process for removing the etching mask having been used in the etching process and a restoration process for restoring the film quality of the low-k film, to be executed continuously. In addition, the processing chambers 220A, 220B, 220E and 220F, for instance, may be assigned to function as etching process chambers and the processing chambers 220C and 220D may be assigned to function as processing chambers (hereafter may also be referred to as "post processing chambers") where the post processes, i.e., the ashing process and the restoration process are executed in succession on a wafer W having undergone the etching process. It is to be noted that by adjusting the combination of processing designations to the individual processing chambers 220A~220F, the details of the actual processing to be executed in the substrate processing apparatus 100 can be altered.

The etching process chambers among the plurality of processing chambers in the substrate processing apparatus 100 assume a structure that enables selective etching of the low-k film formed on the wafer W in a specific pattern by raising to plasma a processing gas delivered into the chamber internal space sustaining a low pressure (e.g., 100 mTorr) and delivering ions and radicals generated as the processing gas is raised to plasma to the wafer W. The processing gas used in the etching process may be, for instance, $CF_4$ gas, $CHF_3$ gas, $C_4F_8$ gas, $O_2$ gas, He gas, Ar gas, $N_2$ gas or a mixed gas containing such gases in combination.

(Structural Examples for the Post Processing Chambers)

Figure 3:
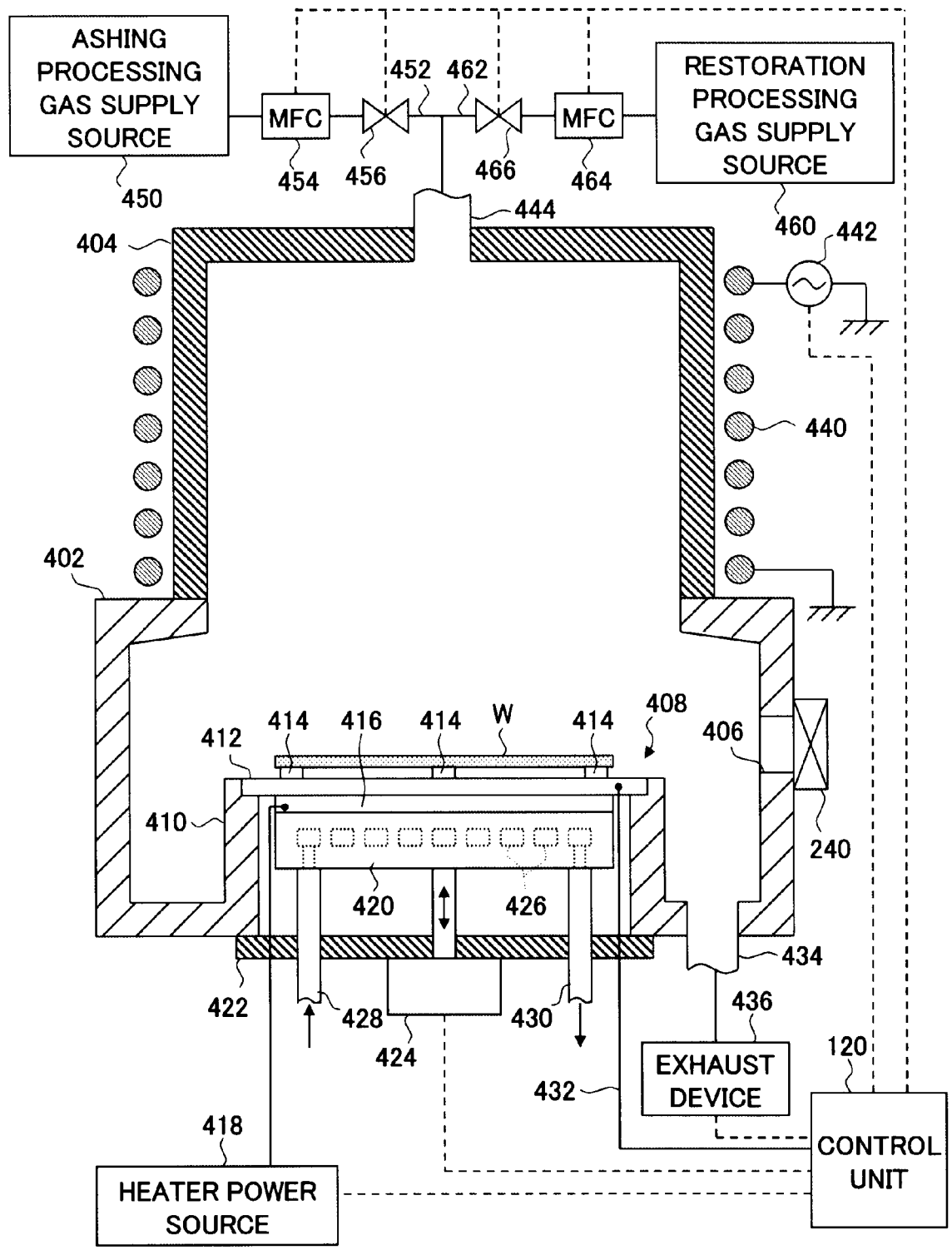
FIG. 3 is a longitudinal sectional view presenting an example of a structure that may be adopted in the post processing chambers in the substrate processing apparatus in the embodiment.

In reference to a drawing, an example of a structure that may be adopted in the post processing chambers is described. As explained earlier, the processing chambers 220C and 220D in the substrate processing apparatus 100 achieved in the embodiment assume a structure that enables them to function as post processing chambers, where the ashing process for removing the etching mask having been used in the etching process and the restoration process for restoring the film quality of the low-k film having been damaged during the etching process, can both be executed in succession. FIG. 3 schematically illustrates the structure adopted in a post processing chamber 400 in the embodiment.

As shown in FIG. 3, the post processing chamber 400 includes a substantially cylindrical main processing chamber 402 and a substantially cylindrical bell jar 404 to function as a plasma generation chamber, which is disposed above the main processing chamber in communication with the main processing chamber 402.

At the side wall of the main processing chamber 402, a transfer port 406, via which the wafer W is transferred out of/into the main processing chamber 402, is present and the gate valve 240 described earlier is mounted at the transfer port 406. As the gate valve 240 is opened, the wafer W can be carried between the post processing chamber 400 and a chamber adjacent to the post processing chamber, i.e., the common transfer chamber 210 in this example.

A stage 408 constituted of ceramic, such as aluminum nitride (AlN), via which the wafer W is supported in a level state, is disposed within the main processing chamber 402. The stage 408 includes a cylindrical base portion 410 formed at the bottom surface of the main processing chamber 402 and a faceplate 412 for supporting the wafer W, mounted levelly at the upper surface of the base portion 410. The faceplate 412 is a disk slightly larger than the wafer W. The faceplate 412 is constituted of a material with superior thermal conductivity, such as silicon carbide (SiC) or aluminum nitride.

At the upper surface of the stage 408 (at the upper surface of the faceplate 412), a plurality of contact pins 414 to contact the lower surface of the wafer W, ranging upright, are disposed. The contact pins 414 are constituted of a material identical to that constituting the faceplate 412, such as ceramic or resin. The wafer W, with its lower surface held at the upper ends of the plurality of contact pins 414, is thus supported in a level state. It is to be noted that a lifter mechanism (not shown) used to place the wafer W transferred into the main processing chamber 402 onto the upper surface of the stage 408 and to lift the wafer off the upper surface of the stage 408, is disposed to surround the wafer W.

On the rear surface (lower surface) side of the faceplate 412, a temperature adjustment unit that adjusts the temperature of the wafer W placed on the upper surface of the faceplate 412 to a predetermined temperature is installed. The temperature adjustment unit is constituted with a cooling unit that lowers the temperature of the wafer W placed on the upper surface of the faceplate 412 and a heating unit that raises the temperature of the wafer W placed on the upper surface of the faceplate 412.

More specifically, a heater 416 constituting the heating unit is mounted in close contact with the rear surface (lower surface) of the faceplate 412. The heater 416 is constituted of a material having superior thermal conductivity, which generates heat as power is supplied thereto, such as SiC. A heater power source 418 is electrically connected to the heater 416 and the wafer W placed on the upper surface of the faceplate 412 can be heated to a specific temperature and is allowed to sustain the temperature at the specific level with the power supplied from the heater power source 418 to the heater 416, which is adjusted to the optimal level. The heater 416 assumes the shape of a disk having a diameter substantially equal to that of the wafer W. Thus, the heat from the heater 416 can be distributed evenly to the entire wafer W via the faceplate 412 so as to uniformly heat the wafer W as a whole.

A cooling block 420 constituting the cooling unit is disposed under the heater 416. The cooling block 420 is allowed to move up/down via an elevator device 424 such as a cylinder supported at a bracket 422 fixed to the lower surface of the main processing chamber 402. More specifically, the cooling block 420 alternately assumes a state in which it is in contact with the lower surface of the heater 416 (a state in which the cooling block 420 is in thermal communication with the faceplate 412) and a state in which it is set apart from the lower surface of the heater 416 (a state in which the cooling block 420 is thermally isolated from the faceplate 412). It is to be noted that the cooling block 420 assumes the shape of a circular column with a diameter substantially equal to the diameter of the wafer W and the entire upper surface of the cooling block in the elevated state contacts the rear surface of the heater 416.

Inside the cooling block 420, a coolant passage 426, through which a coolant such as a fluorine group inert chemical (e.g., GALDEN) travels is formed. As the coolant, having entered a coolant supply piping 428, circulates through the coolant passage 426 and then exits the coolant passage via a coolant discharge piping 430, the cooling block 420 is cooled to, for instance, approximately 25° C. It is to be noted that the coolant supply piping 428 and the coolant discharge piping 430 are each constituted with a bellows, a flexible tube or the like, so as to ensure that the delivery/discharge of the coolant is not hindered by the coolant block 420 as it moves up/down via the elevator device 424 mentioned earlier.

The wafer W placed on the upper surface of the faceplate 412 can be cooled quickly with the cooling block 420 raised via the elevator device 424 and set in contact with the lower surface of the heater 416. Since the cooling block 420 assumes the shape of a disk with a diameter substantially equal to that of the wafer W, the heat originating from the entire wafer W can be transferred to the cooling block 420 via the faceplate 412 and the heater 416, and thus, the whole wafer W can be cooled evenly.

The overall thermal capacity, representing that sum of the thermal capacities of the faceplate 412 and the heater 416, is set lower than the thermal capacity of the cooling block 420. In more specific terms, the faceplate 412 and the heater 416 both assume shapes that will ensure that they have relatively small thermal capacities, e.g., a shape with a small thickness, and they are both constituted of a material with good thermal conductivity, such as SiC. The cooling block 420, on the other hand, assumes the shape of a circular column with a thickness greater than the sum of the thicknesses of the faceplate 412 and the heater 416.

When the cooling block 420 is raised and in contact with the lower surface of the heater 416, heat is transferred from the heater 416, the faceplate 412 and the wafer W placed on the upper surface of the faceplate 412 to the cooling block 420. Since the thermal capacity of the cooling block 420 is considerably greater than the thermal capacities of the heater 416, the faceplate 412 and the wafer W, the wafer W placed on the upper surface of the faceplate 412 can be quickly cooled.

When the cooling block 420 is in the lowered state, away from the lower surface of the heater 416, the faceplate 412 can be heated with by supplying power to the heater 412. Since the thermal capacity of the faceplate 412 is relatively small, the faceplate 412 can be promptly heated to a specific temperature and as the faceplate 412 is thus heated, the wafer W placed on the upper surface of the faceplate 412 is also rapidly heated.

A temperature sensor head such as a thermocouple 432 is installed at the faceplate 412. An electrical signal (voltage) generated at the thermocouple 432 indirectly indicates the temperature of the wafer W placed on the upper surface of the faceplate 412. Based upon the electrical signal received from the thermocouple 432, the control unit 120 is able to control the level of the power output from the heater power source 418 and move up/down the cooling block by controlling the operation of the elevator device 424, so as to adjust the temperature of the wafer W to the specific level within a range of, for instance, 180° C.~400° C.

A discharge pipe 434 is connected to the bottom wall of the main processing chamber 402 and a exhaust device 436 equipped with a vacuum pump such as a turbo molecular pump is connected to the discharge pipe 434. By engaging the exhaust device 436 in operation, the pressure inside the main processing chamber 402 and the bell jar 404 can be reduced until a predetermined degree of vacuum is achieved.

The bell jar 404, constituted of an electrically insulating material such as quartz or ceramic, includes an induction field forming unit that forms an induction field to be used to generate hydrogen plasma inside the bell jar. The induction field forming unit is constituted with a coil 440 wound around the bell jar 404 and a high-frequency power source 442 connected to the coil 440 and capable of supplying high-frequency power with the frequency set within a range of, for instance, 300 kHz~60 MHz. By adjusting the level and frequency of the high-frequency power supplied from the high-frequency power source 442 to the coil 440, an induction field with a specific, desired level of intensity can be formed inside the bell jar 404.

In the post processing chamber 400 structured as described above, plasma can be generated through the inductively coupled plasma (ICP) method. Since the plasma is generated in the space above and away from the wafer W, the post processing chamber may also be referred to as a "remote plasma-type (or a downflow plasma-type)" chamber. It is to be noted that while hydrogen plasma is formed through the inductively coupled plasma method in the post processing chamber 400 in the embodiment, the present invention is not limited to this example and it may be adopted in conjunction with, for instance, hydrogen plasma generated through the microwave excitation method. It may also be adopted in conjunction with hydrogen radicals (atomic hydrogen) H* generated by placing a hydrogen-containing gas in contact with a high temperature catalyser (e.g., a high temperature catalyst wire).

A processing gas supply piping 444 is connected at the ceiling wall of the bell jar 404. A hydrogen-containing gas supply unit and a β-diketone compound-containing gas supply unit are connected to the processing gas supply piping 444. The hydrogen-containing gas supply unit comprises an ashing processing gas supply source 450 from which a hydrogen-containing gas to be used as an ashing processing gas is output, an ashing processing gas supply piping 452 connecting the ashing processing gas supply source 450 with the processing gas supply piping 444 and a mass flow controller 454 and a switching valve 456 disposed at the ashing processing gas supply piping 452. The ⊖-diketone compound-containing gas supply unit comprises a restoration processing gas supply source 460 from which a gas containing a β-diketone compound with an ignition point equal to or higher than 300° C., to be used as a restoration processing gas, is output, a restoration processing gas supply piping 462 connecting the restoration processing gas supply source 460 with the processing gas supply piping 444 and a mass flow controller 464 and a switching valve 466 disposed at the restoration processing gas supply piping 462.

The operations of the mass flow controllers 454 and 464 and the switching valves 456 and 466 are controlled by the control unit 120. Thus, the control unit 120 is able to select a specific processing gas (the ashing processing gas or the restoration processing gas) to be delivered into the post processing chamber 400 and adjust the flow rates of the various processing gases based upon the processing condition (process recipe) data 146 stored in the storage unit 140.

A gas with which hydrogen radicals (atomic hydrogen) H* can be generated, e.g., hydrogen gas or a mixed gas containing hydrogen gas and an inert gas (such as helium gas, argon gas or neon gas), is used as the ashing processing gas in the embodiment. A mixed gas used as the ashing processing gas should contain hydrogen gas mixed with its ratio adjusted to, for instance, 4%.

In addition, the restoration processing gas used in the embodiment should contain a β-diketone compound with an ignition point equal to or higher than 300° C. More specifically, a gas containing dipivaloylmethane (DPM) (hereafter referred to as "DPM gas") or a gas containing acetylacetone (hereafter referred to as "acetylacetone gas") may be used. The structural formulae (A) for DPM and the structural formulae (B) for acetylacetone are provided below.

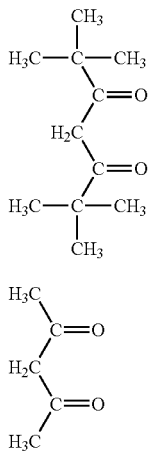

(A)

(B)

The wafer W undergoes the ashing process in the post processing chamber 400 structured as described above, with its temperature raised to the specific level (e.g., 250° C.) while the hydrogen-containing gas used as the ashing processing gas is supplied into the bell jar 404 and the high-frequency power is supplied from the high-frequency power source 442 to the coil 440. With the induction field formed inside the bell jar 404 as a result, plasma is generated from the hydrogen-containing gas inside the bell jar 404 and hydrogen radicals H* are thus generated. The hydrogen radicals are then delivered to the wafer W placed on the stage 408 and the wafer W is ashed with the hydrogen radicals. Through this process, the etching mask on the wafer W is removed.

The wafer W undergoes the restoration process in the post processing chamber 400 with its temperature adjusted to the same level (e.g., 250° C.) as that set for the ashing process while the DPM gas or the acetylacetone gas to be used as the restoration processing gas is delivered into the post processing chamber 400. With the DPM gas or the acetylacetone gas delivered to the wafer W placed on the stage 408, the low-k film on the wafer W, having been damaged during the etching process or the ashing process, can be restored to good condition.

As described above, the DPM gas or the acetylacetone gas with in ignition point of 300° C. or higher, higher than the ignition points of the processing gases used in the related art, is delivered into the post processing chamber 400 to be used for the restoration process, in addition to the gas used for the hydrogen radical ashing process. Thus, the restoration process can be executed in succession in the same post processing chamber 400 following the ashing process. The ashing process and the restoration process executed in the post processing chamber 400 are to be described in detail later.

A silylating gas such as TMSDMA or DMSDMA is normally used as the restoration processing gas when restoring the low-k film damaged during the etching process or the ashing process in the related art. However, silylating gases tend to ignite at relatively low temperatures. For instance, the ignition point of a gas containing TMSDMA (hereafter may be referred to as a "TMSDMA gas") is approximately 220° C. This means that the silylating gas delivered into the processing chamber for the restoration process may ignite if the temperature of the wafer having undergone the ashing process in the same processing chamber is high.

The ashing process with oxygen radicals is executed with the wafer temperature set to a lower level (e.g., 100° C.~150° C.) than the ignition point of the silylating gas (220° C.). Thus, the silylating gas delivered into the same processing chamber following the ashing process so as to immediately execute the restoration processing in the processing chamber is not likely to ignite. Hydrogen radical processing, which is executed on the wafer sustaining a higher temperature (e.g., 250° C.~400° C.) than the wafer temperature set for the oxygen radical processing, is more problematic in that a silylating gas with a low ignition point (e.g., 220° C.) delivered into the same processing chamber for the restoration process following the hydrogen radical processing is highly likely to ignite. In short, the restoration process in the related art, executed by using a silylating gas with a low ignition point, cannot be executed in the same processing chamber where the ashing process has been executed with hydrogen radicals.

The inventor of the present invention et al. found it of significant interest that the ignition points of many gases containing a β-diketone compound often used when forming a metal film in the related art, are higher, at 300° C. or more, than the ignition temperatures of the silylating gases used in the related art. The ignition point of DPM gas that contains a β-diketone compound is 300° C., whereas the ignition point of an acetylacetone gas also containing a β-diketone compound is 350° C., both higher than the ignition point of a silylating gas (the ignition point of, for instance, a TMSDMA gas is 220° C.).

Tests conducted by the inventor of the present invention et al. revealed that a gas containing a β-diketone compound can be used in a restoration process executed to restore an area damaged during the etching process or the like. It was further learned that significantly greater advantages are achieved by using a β-diketone compound-containing gas in the restoration process, as detailed later, than those achieved through the restoration process executed by using a silylating gas.

In the embodiment conceived based upon these findings indicating advantages of the use of a gas containing a β-diketone compound in the restoration process, the ashing process executed with hydrogen radicals and the restoration process, requiring separate processing chambers in the related art, are executed in a single post processing chamber 400 made possible through the use of a gas containing a β-diketone compound with an ignition point of 300° C. or higher (e.g., DPM gas or acetylacetone gas) in the restoration process.

According to the present invention described above, a gas containing a β-diketone compound with an ignition point of 300° C. or higher, i.e., higher than the ignition points of the gases used in the related art, is used in the restoration process. Thus, following the ashing process executed with hydrogen radicals on the processing target substrate sustained at a relatively high temperature, the restoration process can be executed continuously within the same post processing chamber 400. As long as the temperature of the wafer following the ashing process is sufficiently lower than the ignition point, the restoration process can be executed by using the β-diketone compound-containing gas immediately afterwards. Thus, an improvement in throughput over the related art, in which the different processes must be executed in separate processing chambers, is achieved.

In addition, depending upon the processing conditions, the temperature of the wafer immediately after the ashing process may be higher than the ignition point. However, even under such circumstances, the restoration process can be executed with the β-diketone compound-containing gas after allowing the processing target substrate to cool down to a temperature lower than the ignition point. In this case, too, only a short wait time is required following the ashing process before the restoration process can be executed, since the ignition point of the gas used in the restoration process in the embodiment is 300° C. or higher, which is higher than the ignition points of the gases used in the related art. As a result, the throughput is not lowered significantly.

In addition, the film quality of the damaged area of the low dielectric constant insulating film, having become damaged during the etching process or the ashing process, is restored to a desirable condition and the damaged area can be dehydrated more readily and effectively compared to the related art.

In the post processing chamber 400 in the embodiment, the cooling block 420, which cools the wafer W on the stage 408, is installed and thus, the ashed wafer can be quickly cooled. Specifically, after turning off the power supply from the heater power source 418 to the heater 416, the cooling block 420 is raised by engaging the elevator device 424 in operation until the cooling block is placed in close contact with the lower surface of the heater 416 and the wafer W, placed on the upper surface of the faceplate 412, can thus be cooled quickly. Through these measures, it is ensured that even when the temperature of the wafer following the ashing process is higher than the ignition point, the wafer is allowed to quickly cool down to a temperature sufficiently lower than the ignition point. Since the length of wait time to elapse before the restoration process is executed is minimized through the temperature monitoring, better throughput is achieved.

It is to be noted that a further improvement in throughput of the restoration process executed in succession to the ashing process can be achieved by selecting an optimal type of processing gas to be used in the restoration process in correspondence to the wafer temperature during the ashing process. For instance, a gas containing a β-diketone compound with a higher ignition point may be used when the temperature of the wafer having undergone the ashing process is higher, so as to ensure that the restoration process can be executed with a minimum wait time following the ashing process.

In addition, by adopting the embodiment, which allows both the ashing process executed with hydrogen radicals and the restoration process to be executed in a single post processing chamber 400, the substrate processing apparatus 100 equipped with such a post processing chamber 400 can be provided as a more compact unit with the available space therein utilized more efficiently. Furthermore, the substrate processing apparatus is allowed to include a plurality of post process chambers 400 without significantly increasing its installation space. This, in turn, leads to a higher level of reliability of the substrate processing apparatus 100. Namely, in the event of trouble occurring in a given post processing chamber 400, the ashing process and the restoration process can still be executed in another post processing chamber 400. Thus, even if trouble occurs, the processing on a batch of wafers W can be continuously executed without having to stop the substrate processing apparatus 100. Consequently, any reduction in the throughput of the substrate processing apparatus 100 can be minimized in the event of trouble. Moreover, since the ashing process and the restoration process can be executed in succession, concurrently in the plurality of post processing chambers 400, a further improvement in the throughput of the substrate processing apparatus 100 can be achieved.

(Specific Example of the Film Structure in the Processing Target Wafer)

Figure 4:
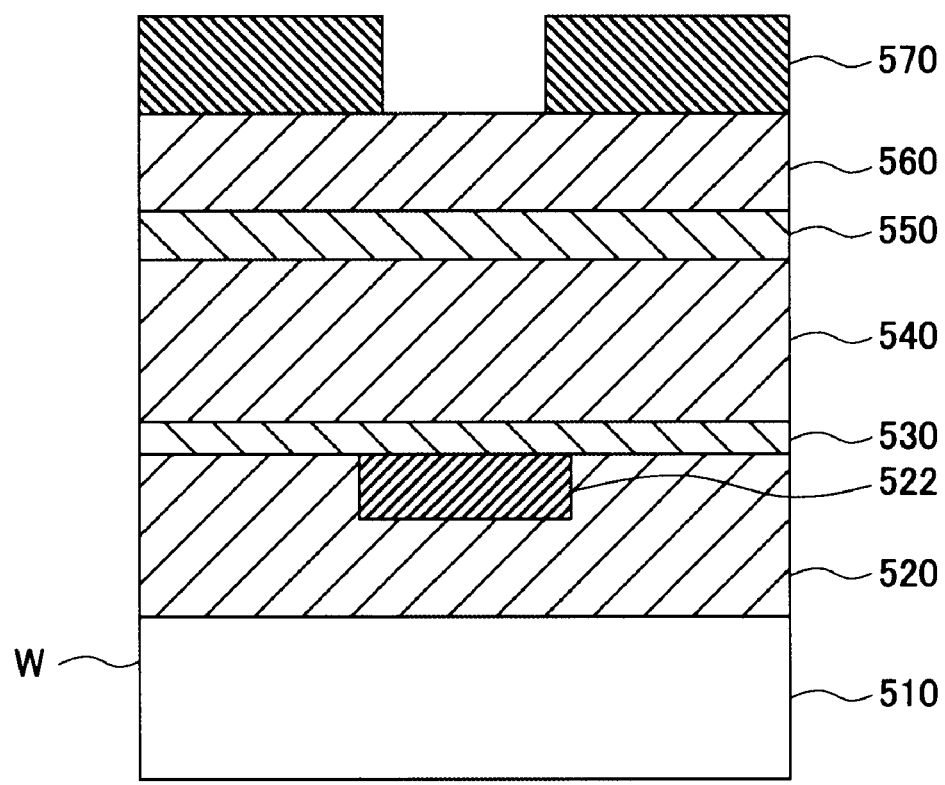
FIG. 4 is a sectional view presenting a specific example of a film structure that may be assumed in a wafer in the pre-processing state, before undergoing processing in the substrate processing apparatus in the embodiment.

Next, a specific example of the film structure in the processing target wafer W to undergo the subsequent of processing (the etching process, the ashing process and the restoration process) at the substrate processing apparatus 100 in the embodiment described above is explained. FIG. 4 is a sectional view of a specific example of the film structure in an unprocessed wafer W yet to undergo the processing in the substrate processing apparatus 100.

The film structure at the wafer W shown in FIG. 4 includes a plurality of films formed over a Si substrate (silicon substrate) 510. In more specific terms, it includes a base insulating film 520 constituted of $SiO_2$ or the like, which is formed on top of the Si substrate 510, a metal layer 522 formed by burying, for instance, Cu in the base insulating film 520, an etching stopper film 530 constituted of SiC or the like, which is formed over the base insulating film 520, a low-k film 540 formed over the etching stopper film, which is constituted of a material containing silicon and has a methyl-group ($CH_3$ group) skeleton, a capping film 550 formed over the low-k film and constituted of $SiO_2$ or the like, an anti-reflection coating (BARC) 560 formed over the capping film and a photoresist film 570 formed over the anti-reflection coating 570.

Such a film structure can be achieved at the wafer W by executing film formation processing and the like in a specific sequence on the Si substrate 510 at a substrate processing apparatus (not shown) different from the substrate processing apparatus 100. In addition, after the photoresist film 570 is formed, the wafer W undergoes a photolithography process and thus, a specific wiring pattern is formed at the photoresist film 570.

(Specific Example of Wafer Processing)

Figure 5:
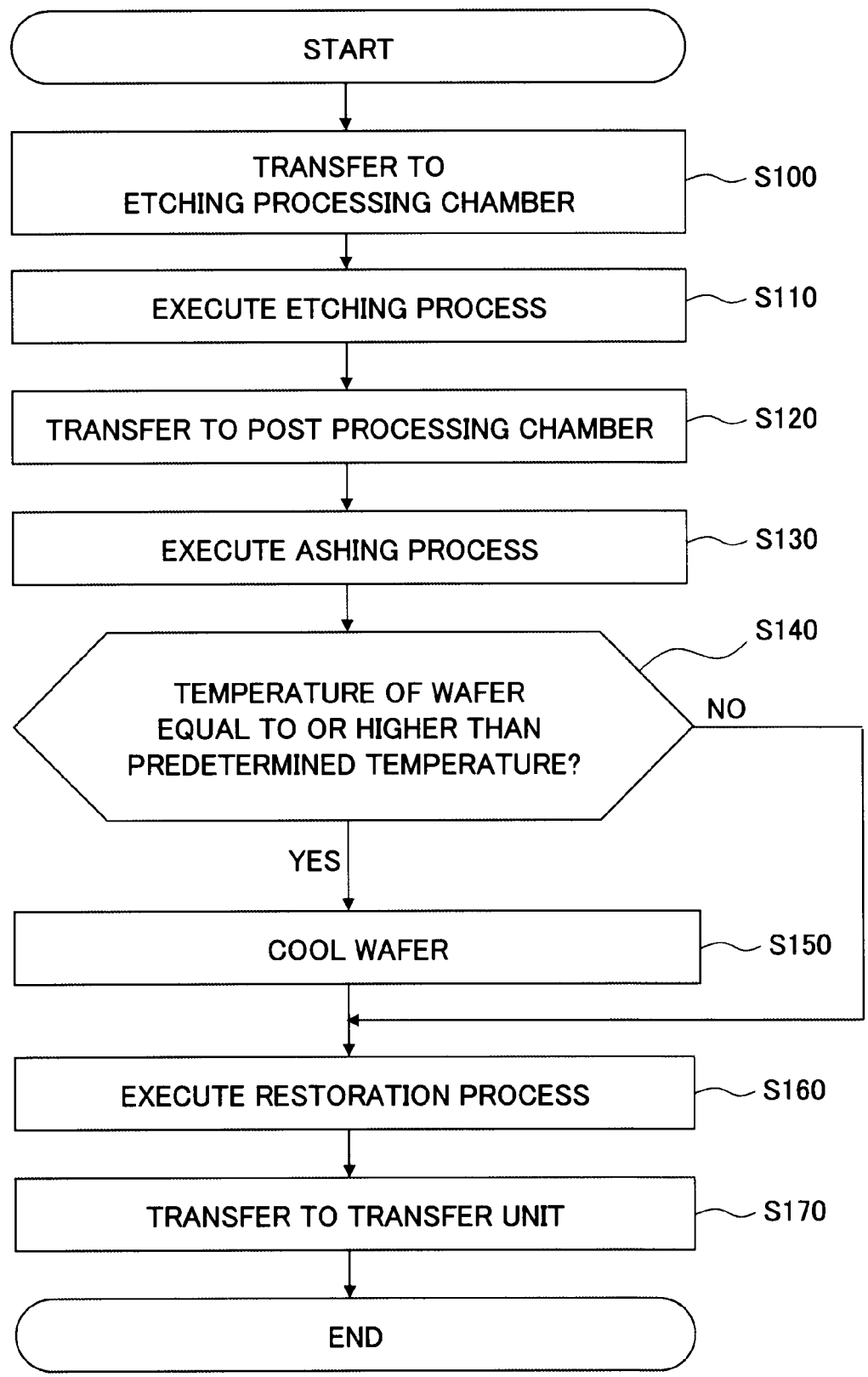
FIG. 5 presents a flowchart of the wafer processing executed in the substrate processing apparatus in the embodiment.

Next, in reference to a drawing, the entire sequence of processing that the wafer W undergoes at the substrate processing apparatus 100 is described. FIG. 5 presents a flowchart of the processing executed in the substrate processing apparatus 100 in the embodiment. The processing sequence is executed on the wafer W at the substrate processing apparatus 100 as the control unit 120 controls the individual units based upon a specific program. The processing sequence to be explained in reference to the embodiment includes an etching process, an ashing process and a restoration process executed in this order on a wafer W assuming a film structure such as that shown in FIG. 4, which is transferred in a low-pressure environment to the individual processing chambers.

In step S100, the wafer W assuming the film structure shown in FIG. 4 having been taken out of a cassette container 102, is transferred to one of the processing chambers 220A, 220B, 220E and 220F designated as etching process chambers in the substrate processing apparatus 100. More specifically, a wafer W in a cassette container 102 is transferred to the orienter 304 via the transfer unit-side transfer mechanism 320 and the wafer W is then positioned at the orienter The wafer W having been positioned at the orienter 304 is taken back onto the transfer unit-side transfer mechanism 320 which then carries it into either the first loadlock chamber 230M or the second loadlock chamber 230N, e.g., the first loadlock chamber 230M. Subsequently, the wafer W in the first loadlock chamber 230M is carried on the processing unit-side transfer mechanism 250 into one of the processing chambers 220A, 220B, 220E and 220F designated as the etching process chamber, e.g., the etching process chamber 220A (Specific Example of the Etching Process)

Next, a specific type of etching process is executed on the wafer W in step S110. The etching process executed in the processing chamber (etching process chamber) 220A is described in specific terms. A processing gas such as $CF_4$ gas is delivered into the processing chamber 220A and high-frequency power is supplied between the electrodes disposed within the processing chamber 220A so as to generate plasma from the processing gas over the wafer. Through this process, the anti-reflection coating 560, the capping film 550, the low-k film 540 and the etching stopper film 530 become sequentially and selectively etched with the patterned photoresist film 570 used as a mask.

Figure 6:
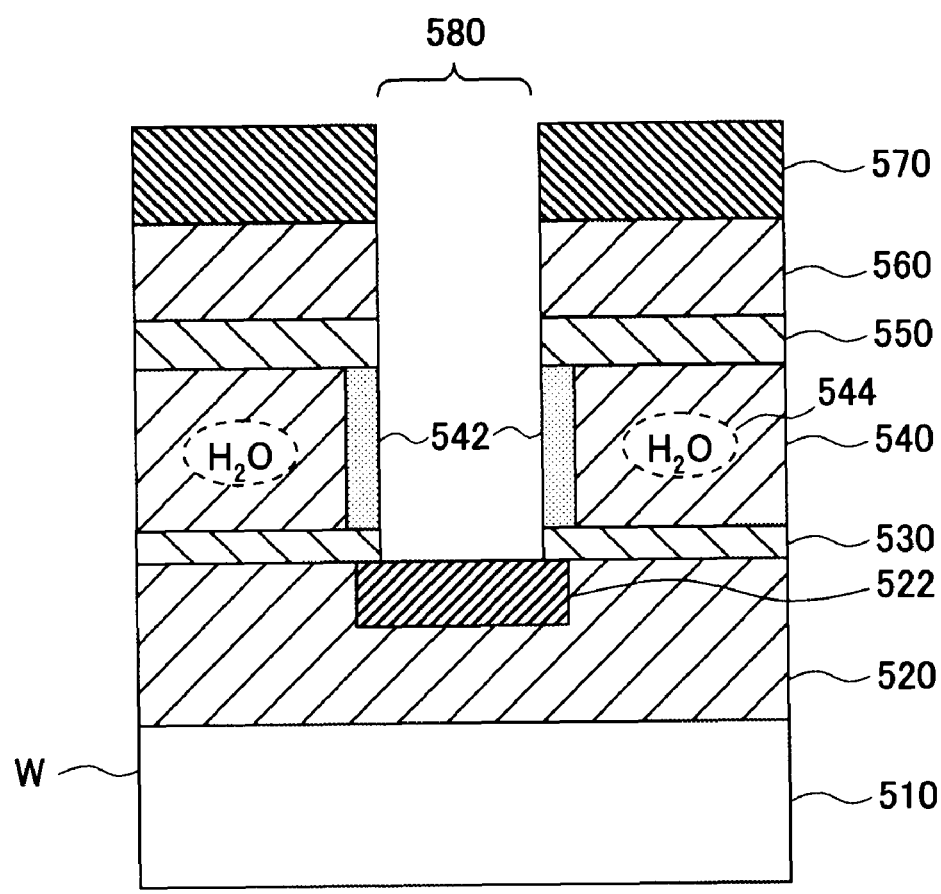
FIG. 6 is a sectional view presenting a specific example of a film structure that may be assumed at the wafer following the etching process.

Through the etching process executed as described above, a wiring groove (hereinafter, the term "wiring groove" may also refer to a wiring hole) 580 is formed as a recessed portion in the low-k film 540 as shown in FIG. 6. As a result, the surface of the low-k film 540 becomes exposed at the side wall of the wiring groove 580 and the surface of the metal layer 522 becomes exposed at the bottom of the wiring groove 580.

(How the Etching Process may Affect the Low-k Film)

The adverse effects of the etching process that the low-k film may be subjected to are now explained. As the low-k film 540 is etched with the process gas such as $CF_4$ gas, a damaged area is formed near the surface of the low-k film 540 exposed at the wiring groove 580 as shown in FIG. 6. In the damaged area 542, the $CH_3$ group decreases through a reaction with the fluorine contained in the $CF_4$ gas and the hydroxyl group (OH group) increases markedly through a reaction with water, resulting in an increase in the dielectric constant of the low-k film 540. If such a damaged area 542 is left unrestored, the electrical characteristics of semiconductor devices produced as final products from the wafer W may be compromised. It is to be noted that while FIG. 6 schematically illustrates the damaged area 542, the boundary of the damaged area 542 and an undamaged area is not necessarily as clear as that shown in FIG. 6.

In addition, a low-k film is normally constituted of a porous material having a high level of water absorption capacity. Furthermore, low-k film 540 will absorb water even more readily over the damaged area 542 formed during the etching process, as shown in FIG. 6. This means that if the wafer W is taken out of the substrate processing apparatus 100 immediately after the etching process without first executing the restoration processing to be detailed later, the low-k film 540 in the damaged state will be exposed at the wiring groove 580. Under such circumstances, water in the air will be absorbed readily through the damaged area 542 into the low-k film 540.

The presence of water 544 in the low-k film 540 degrades the quality of the low-k film 540 both with regard to its electrical characteristics and with regard to its mechanical characteristics. The dielectric constant of water is higher than that of air and thus, as the quantity of water 544 contained in the low-k film 540 increases, the overall dielectric constant of the low-k film 540 will increase, resulting in poorer electrical characteristics.

In addition, as the presence of water 544 in the low-k film 540 compromises the mechanical strength of the low-k film, the shape of the wiring groove 580 with an extremely small width having been formed through etching may lose its intended shape before the wiring metal is embedded therein. Furthermore, various types of films including another low-k film cannot be layered upon the low-k film 540 with lowered mechanical strength in a stable manner. In other words, the low-k film 540 may not have the mechanical strength required in a multilayer wiring structure. Moreover, if the low-k film 540 does not assure a sufficient level of strength, the low-k film 540 and the film (e.g., the etching stopper film 530 or the capping film 550) in contact with the surface of the low-k film may become separated from each other.

As semiconductor circuits assume increasingly fine circuit structures with a greater number of films layered therein, it has become a crucial requirement in recent years that the low-k film 540 maintain its mechanical strength as well as its electrical characteristics. For this reason, it is essential that following the etching process, a process be executed so as to ensure that as much water as possible is released from the low-k film 540 and that any further absorption of water into the low-k film 540 is minimized.

Accordingly, a restoration process is executed on the wafer W in the embodiments in order to restore the film quality of the low-k film damaged in the etching process to a desirable state before the wafer W is carried out of the substrate processing apparatus 100 and is exposed to the air.

More specifically, upon completing the etching process (step S110), the etched wafer W is transferred into either the processing chamber 220C or 220D, both structured to function as post processing chambers 400, in step S120 in FIG. 5.

(Specific Example of the Ashing Process)

Next, in step S130, a specific ashing process is executed on the wafer W by using hydrogen radicals. This ashing process is now described in specific detail in reference to FIG. 3. In preparation for the ashing process, to be executed in the processing chamber 220C or 220D functioning as the post processing chamber 400, the gate valve 240 is opened, the wafer W having undergone the etching process, such as that shown in FIG. 6, is carried into the main processing chamber 402 and the wafer W is placed onto the stage 408. An explanation is given on an example in which the ashing process is executed in the processing chamber 200C.

Once the wafer W is carried into the processing chamber, the gate valve 240 is closed and the main processing chamber 402 and the bell jar 404 are evacuated by the exhaust device 436 until the pressure therein is lowered to a predetermined level (e.g., 1.5 Torr).

Then, the switching valve 456 is opened and a specific ashing processing gas, e.g., a mixed gas containing hydrogen gas and helium gas (with the hydrogen gas mixed at a ratio of, for instance, 4%) is delivered from the ashing processing gas supply source 450 via the ashing processing gas supply piping 452 and the processing gas supply piping 444 into the bell jar 404. The flow rate of the ashing processing gas is adjusted via the mass flow controller 454.

In addition, high-frequency power (e.g., 4000 W) is supplied from the high-frequency power source 442 to the coil 440. As a result, plasma is formed inside the bell jar 404 under stable conditions and hydrogen radicals H* are generated. The hydrogen radicals H* are then supplied downward toward the wafer W placed on the stage 408 within the main processing chamber 402 located below.

With the heater 416 pre-heated by controlling the heater power source 418, the wafer W is heated to a predetermined temperature (e.g., a processing temperature of 250° C.) optimal for the ashing process and the heated wafer sustains the specific temperature.

Figure 7:
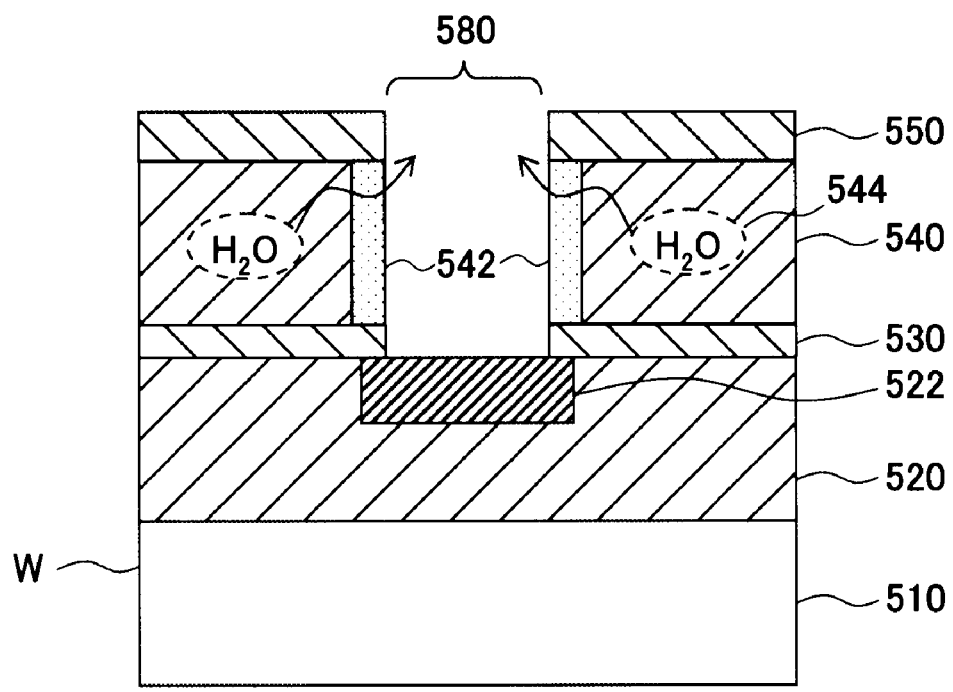
FIG. 7 is a sectional view presenting a specific example of a film structure that may be assumed at the wafer following the ashing process.

As the hydrogen radicals are delivered toward the wafer W sustaining the predetermined temperature (e.g., 250° C.) in the post processing chamber 400, the wafer W undergoes the ashing process. FIG. 7 shows the film structure of the wafer W having undergone the ashing process. As shown in FIG. 7, the photoresist film 570 and the anti-reflection coating 560 are removed from the wafer W through the ashing process.

Once the photoresist film 570 and the anti-reflection coating 560 are removed, the switching valve 456 is closed to stop the delivery of the ashing processing gas from the ashing processing gas supply source 450 into the bell jar 404 and also the output of the high-frequency power from the high-frequency power source 442 to the coil 440 is turned off. In addition, the output of the power from the heater power source 418 to the heater 416 is lowered or stopped. The ashing process is thus completed.

In addition, since the wafer W is heated to a relatively high temperature of, for instance, 300° C. during the ashing process, water 544 present in the low-k film can be released as well as water present at the surface of the low-k film 540, in addition to removing the photoresist film 570 and the anti-reflection coating 560 as described above. However, if the temperature of the wafer W becomes excessively high, the low-k film 540 will be thermally degraded. Accordingly, it is desirable to set the predetermined temperature to be achieved at the wafer W during the ashing process within a range of 250° C.~400° C., over which water 544 can be efficiently released from the low-k film 540 without degrading the low-k film 540.

If a fluorine-containing gas such as $CF_4$ gas is used as the processing gas for the etching process executed prior to the ashing process, the metal (e.g. copper) constituting the metal layer 522 exposed at the bottom of the wiring groove 580 will react with the fluorine contained in the processing gas, resulting in the formation of an undesirable metal compound film (e.g., a CuF film) at the exposed surface. If such a metal compound film is present over the area where the wiring metal, such as copper, to be embedded at the wiring groove 580 in a subsequent step, is to connect with the metal layer 522, the electrical resistance over the connecting area will increase and, as a result, desirable electrical characteristics cannot be assured in the multilayer wiring structure.

The embodiment addresses this issue by executing a specific type of ashing process through which any metal compound film (e.g., a CuF film) present over the exposed surface of the metal layer 522 is reduced and removed with the hydrogen radicals. Since the exposed surface of the metal layer 522 is thus cleaned and is restored as a pure metal surface, the surface resistance is greatly lowered.

In the ashing process in the related art, plasma raised from an oxygen-containing gas (hereinafter may also be referred to as "oxygen-containing plasma") is often used. However, during the ashing process executed by using such oxygen plasma, the low-k film 540 tends to be damaged by oxygen radicals. Namely, the oxygen radicals, which are highly reactive, react with the $CH_3$ group in the low-k film 540 and through this reaction, an OH group is formed. Such damage is extremely difficult to repair. More specifically, a chemical reaction involving oxygen radicals occurs around the damaged area 542 of the low-k film 540 having become damaged during the etching process. The oxygen radicals penetrate the low-k film 540 through the exposed surface to form an area densely packed with Si—O (to be referred to as a "shrink layer" in the description). The shrink layer formed over the damaged area 542 makes it difficult to fully recover from the damage in the damaged area 542, since the shrink layer hinders full penetration of the processing gas during the subsequent restoration process.

In contrast, the hydrogen-containing gas with no oxygen atom content is utilized in the ashing process in the embodiment. This means that since no oxygen radicals are generated, a shrink layer is not formed over the damaged area 542 in the low-k film 540 and instead, Si—H bonds are presumably formed in the damaged area 542. The Si—H bond can be easily reverted to the initial Si—$CH_3$ state through the use of DPM gas or acetylacetone gas. Accordingly, by using DPM gas or acetylacetone gas as the processing gas in the restoration process executed after the ashing process, the film quality in the damaged area 542 of the low-k film 540 can be restored to a good condition.

Through the ashing process executed in the embodiment as described above, the water 544 present in the low-k film 540 can be removed and the exposed surface of the metal layer 522 can be cleaned, as well as removing the photoresist film 570 and the anti-reflection coating 560 from the wafer W, which is the main purpose of the process. In addition, the composition of the low-k film 540 over the damaged area 542 can be altered so that the damaged area 542 is more effectively restored through the restoration process.

As shown in FIG. 5, following the ashing process (step S130) executed on the wafer W in the processing chamber 220C functioning as the post processing chamber 400, a decision is made in step S140 as to whether or not the temperature of the wafer W is equal to or higher than a predetermined level. In the embodiment, the temperature of the wafer W is detected before delivering the restoration gas into the processing chamber 220C, so as to ensure that no ignition of the restoration gas delivered into the processing chamber 220C for the subsequent restoration process, does not occur. Accordingly, it is desirable to preselect a temperature setting within a range lower than the ignition point of the restoration processing gas, as the predetermined temperature.

The predetermined temperature should be set by allowing a considerable margin in correspondence to the ignition point of the restoration processing gas. For instance, the predetermined temperature may be set to 250° C. in conjunction with the DPM gas with an ignition point of approximately 300° C. used as the restoration processing gas, thereby allowing a margin of 50° C. under the 300° C. ignition point. Alternatively, the predetermined temperature may be set to 260° C., thereby allowing a margin of 40° C. In addition, the predetermined temperature may be set to 300° C. in conjunction with the acetylacetone gas with an ignition point of approximately 350° C. used as the restoration processing gas, thereby allowing a margin of 50° C. under the 350° C. ignition point, or the predetermined temperature may be set to 3 10° C., thereby allowing a margin of 40° C. By selecting the predetermined temperature in reference to which a decision as to whether or not to further cool the wafer W is made, in correspondence to the ignition point of the specific restoration processing gas, as described above, it is ensured that the wafer W is not cooled to an unnecessarily low temperature prior to the restoration process.

If it is decided in step S140 that the temperature of the wafer W is lower than the predetermined level, the temperature of the wafer is judged to be at a level at which the restoration processing gas delivered into the processing chamber will not ignite and accordingly, the restoration process is immediately started in step S160. If, on the other hand, it is decided in step S140 that the temperature of the wafer W is equal to or higher than the predetermined level, the wafer W is cooled in step S150 until its temperature becomes lower than the predetermined level prior to the restoration process.

As described above, if the temperature of the wafer W having undergone the ashing process is already considerably lower than the ignition point of the restoration processing gas, the restoration process is started immediately without cooling the wafer following the ashing process. In addition, it is ensured that even when the temperature of the wafer W following the ashing process is higher than the ignition point, the wafer W is allowed to cool down to a temperature sufficiently lower than the ignition point. Since the length of wait time to elapse before the restoration process is executed is minimized through the temperature monitoring, a significant improvement in throughput is achieved over the related art in which the ashing process and the restoration process are executed in separate processing chambers.

While control unit 120 in the embodiment indirectly measures the temperature of the wafer W via a temperature sensor head such as the thermocouple 432 installed at the faceplate 412, the present invention is not limited to this example. For instance, another temperature sensor head may be installed at an area inside the processing chamber 220C where the temperature rises to a level higher than the temperature of the wafer W and, in conjunction with the additional temperature sensor head, the control unit may determine the optimal timing with which the restoration processing gas should be delivered by taking into consideration the measurement results provided by the additional temperature sensor head as well.

(Specific Example of Wafer Cooling)

A specific example of the processing executed to cool the wafer W (step S150) is now described. When cooling the wafer W, the output of the power from the heater power source 418 to the heater 416 is first lowered or stopped and the cooling block 420 is raised by engaging the elevator device 424 in operation until the cooling block comes into close contact with the lower surface of the heater 416. The coolant supplied from the outside, the temperature of which is pre-adjusted to, for instance, 25° C., circulates through the cooling block 420. Thus, the wafer W can be cooled with the cooling block 420 via the faceplate 412 and the heater 416 simply by placing the cooling block 420 in close contact with the lower surface of the heater 416. As a result, even when the temperature of the wafer W is equal to or higher than the predetermined temperature mentioned earlier, the overall wafer W can be easily and rapidly cooled to a temperature lower than the predetermined level (e.g., 260° C.). This means that the length of wait time to elapse before the start of the restoration process following the ashing process can be reduced. For instance, a hydrogen radical processing such as the ashing process described above is executed by raising the temperature of the wafer to a high level (e.g., 250° C.~400° C.). Depending upon the processing conditions selected for the hydrogen radical processing, the wafer temperature may be raised even higher, to 400° C.~600° C. Even under such circumstances, the temperature of the wafer cooled with the cooling block 420 can be rapidly lowered to a level considerably lower than the ignition point of the restoration gas.

Once the temperature of the wafer W is lowered to the predetermined temperature level, the elevator device 424 is driven to move the cooling block 420 downward away from the lower surface of the heater 416. The level of the power supplied from the heater power source 418 to the heater 416 is controlled so as to sustain the temperature of the wafer W at a predetermined level (e.g., a processing temperature of 250° C.), optimal for the subsequent restoration process.

Through the cooling process described above, the ashed wafer W, the temperature of which may still be fairly high, can be rapidly cooled, allowing the restoration process to start as soon as possible. In addition, as long as the temperature of the wafer W is already lower than the predetermined temperature at the end of the ashing process, the restoration process can be started immediately without cooling the wafer W. For instance, provided that the predetermined temperature is set at 260° C., as described earlier, the restoration process can be started without having to cool the wafer W if the temperature of the ashed wafer W is 250° C. Since the elevator device 424 does not have to be driven to raise the cooling block 420, the length of wait time to elapse before the restoration process start can be further reduced in this situation.

(Specific Example of the Restoration Process)

Next, a specific example of the restoration process (step S160) is described in reference to drawings. As explained earlier, the restoration process is executed in the same processing chamber 220C functioning as the post processing chamber 400 where the wafer W has already undergone the ashing process, without transferring the wafer W to another processing chamber.

When executing the restoration process in the processing chamber 220C (post processing chamber 400), the processing chamber 220C is evacuated by the exhaust device and the pressure therein is lowered to a predetermined level (e.g., 50 Torr). Then, the switching valve 466 is opened and a specific restoration processing gas, e.g., DPM gas or acetylacetone gas is delivered from the restoration processing gas supply source 460 via the restoration processing gas supply piping 462 and the processing gas supply piping 444 into the bell jar 404. The flow rate of the restoration processing gas, is adjusted via the mass flow controller 464.

Figure 8:
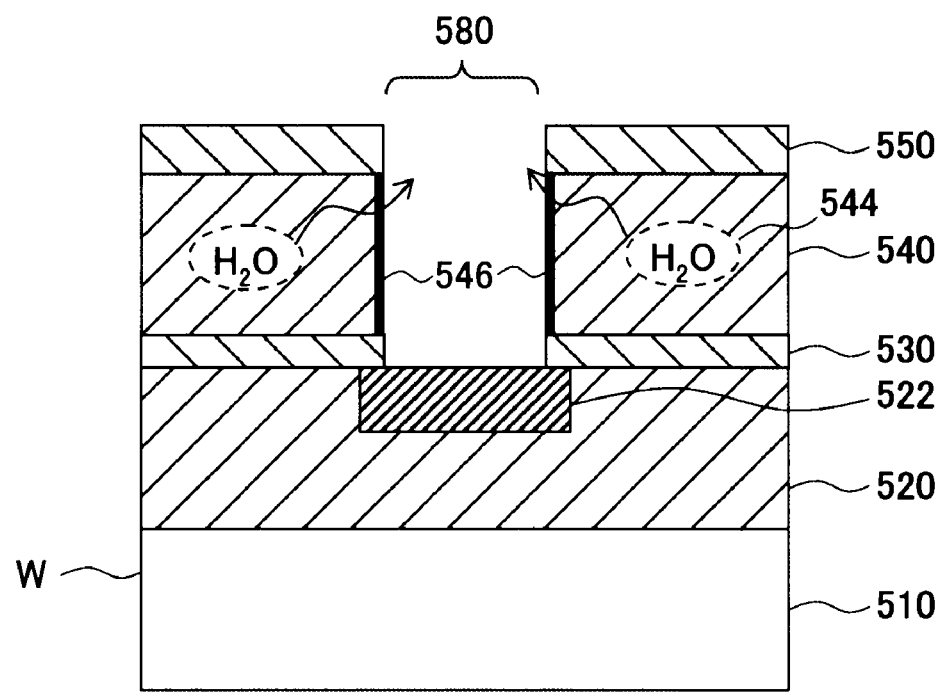
FIG. 8 is a sectional view presenting a specific example of a film structure that may be assumed at the wafer following the restoration process.

In addition, the temperature of the wafer W is sustained via the heater 416 at the optimal level (e.g., a processing temperature of 250° C.) for the restoration process. As a β-diketone compound-containing gas constituting the restoration processing gas, such as acetylacetone gas, is delivered into the processing chamber 220C in this state, the wafer W undergoes the restoration process. FIG. 8 shows the film structure of the wafer W having undergone the restoration process.

As the restoration process is executed by using the restoration processing gas as described above, a chemical reaction occurs over the damaged area 542 of the low-k film 540 and through the chemical reaction, the film quality of the damaged area 542 is restored to a desirable condition, as shown in FIG. 8. Furthermore, through the ashing process executed as described above by using hydrogen radicals immediately before the restoration process in the embodiment, the damaged area 542 of the low-k film 540 has been rendered into a state in which the damaged area readily assumes a $CH_3$ group composition, allowing the damaged area 542 to become fully repaired.

The film quality in the damaged area 542 is restored to the initial desirable condition and, as a result, the damaged area 542 disappears. In addition, the terminal at the surface of the low-k film 540 exposed at the wiring groove 580 takes on a $CH_3$ group composition and, as a result, a water repellent layer 546 is formed. This water repellent layer 546 prevents absorption of any additional water into the exposed surface of the low-k film 540 and prevents the low-k film 540 from being penetrated by water.

Now, the mechanism of the reaction occurring as the film quality in the damaged area 542 of the low-k film 540 is restored by using acetylacetone gas as the restoration processing gas is described in reference to relevant chemical reaction formulae.

The acetylacetone contained in the acetylacetone gas delivered into the processing chamber 220C releases protons through the keto-enol equilibrium, as expressed in chemical formula (1) below.

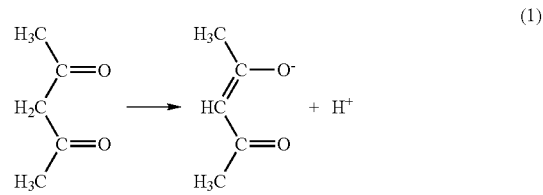

(1)

It is assumed that the damaged area 542 of the low-k film 540, where a relatively large quantity of water is present, has an excessively dominant presence of silanol radicals (SiOH group). As indicated in chemical formula (2) below, a dehydration reaction is induced in the damaged area 542 by the protons released from the acetylacetone and acting on the SiOH group.

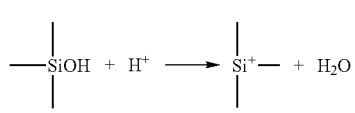
(2)

The acetylacetonate formed as the protons are released from the acetylacetone configures a protective group for the dangling bond of silicone formed as water ($H_2O$) departs the damaged area 542, as indicated in chemical formula (3) below.

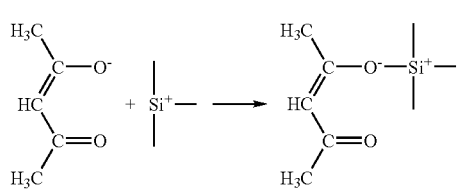
(3)

The α hydrogen in the $CH_3$ group cannot be dissociated readily under normal circumstances. However, in the damaged area 542 where the SiOH group is assumed to be present in large quantity near the $CH_3$ group, the a hydrogen reacts with the OH group contained in the silanol group and thus moves out of the $CH_3$ group as indicated in chemical formula (4).

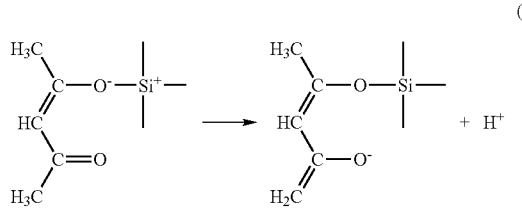
(4)

The $CH_3$ group from which the a hydrogen has been dissociated as described above becomes bonded with the silicone having the dangling bond formed over the damaged area 542 through the chemical reaction expressed in chemical formula (2). As a result, a bridge structure is formed and the film quality of the damaged area 542 is restored to good condition, as indicated in chemical formula (5) below.

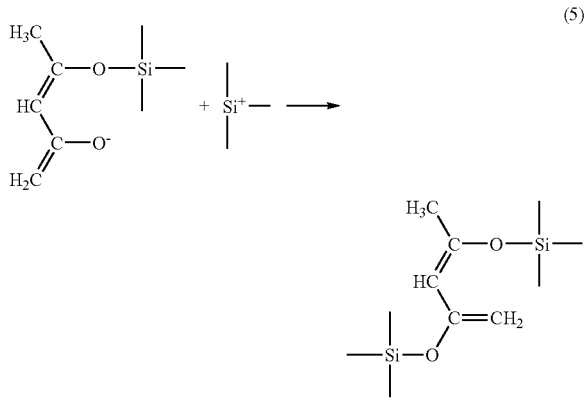
(5)

As described above, by using acetylacetone gas as the restoration processing gas, water present in the damaged area 542 of the low-k film 540 can be effectively removed and the film quality can be restored to good condition. In addition, since five atoms of carbon (C) are accommodated at each bridge, better hydrophobicity compared to the related art is achieved. A dehydration effect and a hydrophobicity effect similar to those described above can also be realized by using another β-diketone compound-containing gas such as DPM gas as the restoration processing gas.

In the embodiment described above, a hydrogen-containing gas is used as the ashing processing gas during the ashing process so as to ensure that no shrink layer is formed over the damaged area 542. In addition, since a β-diketone compound-containing gas such as DPM gas or acetylacetone gas is used as the restoration processing gas during the restoration process, any shrunken structure attributable to a shrink layer that may have been formed over the damaged area 542 can be expanded. As a result, the restoration processing gas can be delivered to penetrate the damaged area 542 over a wide range, so as to restore the film quality of the damaged area 542 even more reliably.

The use of a β-diketone compound-containing gas as the restoration processing gas has the following advantages over the related art, in which a silylating gas is used. First, a silylating gas often contains ammonia radicals ($NH_3$ group), giving rise to a concern that ammonia salt, which can settle as particles on the wafer, may be formed. In contrast, the β-diketone compound-containing gas does not contain any ammonia group and is thus more desirable than a silylating gas, since there will be no formation of ammonia salt.

The process through which the use of a silylating gas results in the formation of ammonia salt and ultimately particles settled onto the wafer W, is now described. FIGS. 9A~9D illustrate the process through which particles settle on the wafer W having undergone the etching process.

A gas constituent (e.g., a halogen gas constituent containing, for instance, F, Br or Cl) in the etching processing gas may become bonded at the surface of the etched wafer W and thus form a compound. The presence of such a compound on the wafer W may result in the formation of particles (reaction products) on the wafer W, particularly if the atmosphere surrounding the etched wafer W contains ammonia.

Figure 9A:
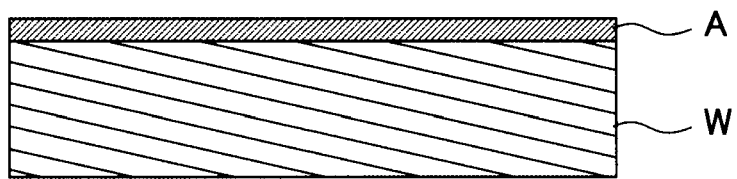
FIG. 9A illustrates part of the process through which particles are formed on the wafer having undergone the etching process.

First, as a constituent of the etching processing gas becomes adhered onto the surface of the wafer W having undergone the etching process, the gas constituent of the etching processing gas and the substance constituting the surface of the wafer W bond with each other, thereby forming a compound A, as shown in FIG. 9A. For instance, if the etching processing gas contains a halogen gas constituent (e.g., F, Br or Cl), the halogen gas constituent may bond with, for instance, $SiO_2$ on the processed wafer W, thereby forming a compound A on the wafer W.

Figure 9B:
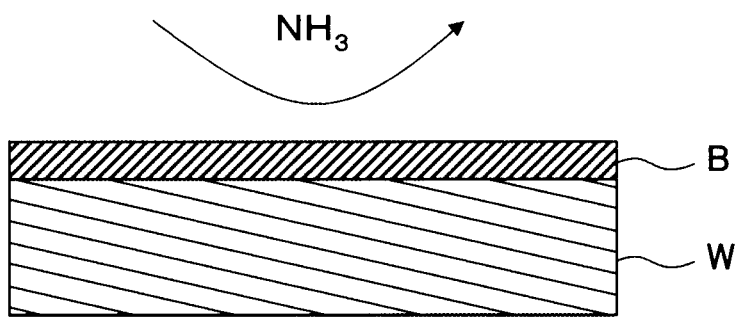
FIG. 9B illustrates part of the process through which particles are formed on the wafer having undergone the etching process.

If the restoration processing gas delivered toward the wafer W subsequently undergoing the restoration process has, for instance, an amine content, the halogen compound in the compound A at the wafer W reacts with the amine content in the restoration processing gas and, as a result, salt B is formed on the surface of the wafer W, as shown in FIG. 9B. The amine content includes, for instance, ammonia, amine and the like. The amine may be, for instance, trimethyl amine, triethyl amine or an organic basic amine.

The sequence of the process through which the salt B is formed at the surface of the wafer W is expressed in chemical formulae (6)~(8) below. The chemical formulae below represent a process through which the substance ($SiO_2$) at the surface of the wafer W bonds with a gas constituent (HF) of the etching processing gas, thereby forming a compound ($SiF_4$), the compound ($SiF_4$) reacts with ammonia ($NH_3$) in the restoration processing gas and halogen ammonia salt (e.g., $(NH_4)_2SiF_6$) is formed.

$$SiO_2 + 4HF \rightarrow SiF_4 + 2H_2O \qquad (6)$$

$$SiO_2 + 4HF + 4NH_3 \rightarrow SiF_4 + 2H_2O + 4NH_3 \qquad (7)$$

$$SiF_4 + 2HF + 2NH_3 \rightarrow (NH_4)_2SiF_6 \qquad (8)$$

It is generally assumed that when the substance ($SiO_2$) present at the surface of the wafer W bonds with a gas constituent (HF) in the etching processing gas and a compound ($SiF_4$) is formed, the reaction expressed in chemical formula (6) occurs.

However, if ammonia (HF3) is present in the restoration processing gas, the reaction expressed in chemical formula (7) may also occur. While the level of the reaction energy required to shift from the state on the left side to the state on the right side in chemical formula (6) is 1.0 eV, the level of reaction energy required to shift from the state on the left side to the state on the right side in chemical formula (7) is only 0.4 eV, far lower than that required in the reaction expressed in chemical formula (6).

Thus, if there is ammonia ($NH_3$) present in the restoration processing gas, the reaction expressed in chemical formula (7) becomes more dominant, and, as a result, the compound ($SiF_4$) will be formed more readily on the surface of the wafer W. This, in turn, prompts the reaction expressed in chemical formula (8), inducing ready formation of halogen ammonia salt (($NH_4)_2SiF_6$).

As described above, if the wafer W, with a halogen gas constituent adhering thereto is exposed to a restoration processing gas containing ammonia ($NH_3$), halogen ammonia salt (e.g., $(NH_4)_2SiF_6$) will be formed on the surface of the wafer W.

Figure 9C:
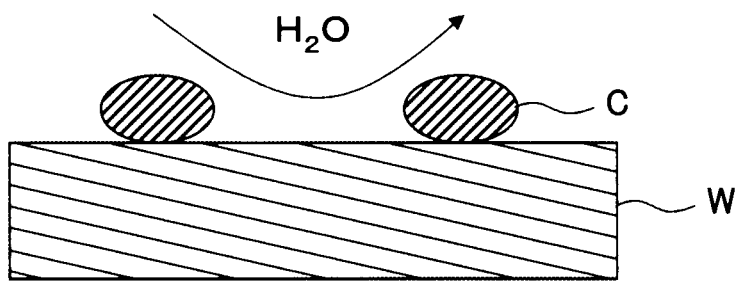
FIG. 9C illustrates part of the process through which particles are formed on the wafer having undergone the etching process.

The salt B such as halogen ammonia salt formed on the surface of the wafer W as described above gradually absorbs water ($H_2O$) in the atmosphere surrounding the wafer W. As time elapses, particles C are formed as shown in FIG. 9C. Namely, very small particles C, approximately 0.001 µm in diameter, too small to be detected even through an electron microscope, are initially formed and their quantity gradually increases while their size also gradually increases. After approximately one hour, for instance, they will have grown in size to approximately 0.1 µm. In 24 hours, some particles C may have grown to as large as 0.5~0.7 µm.

Figure 9D:
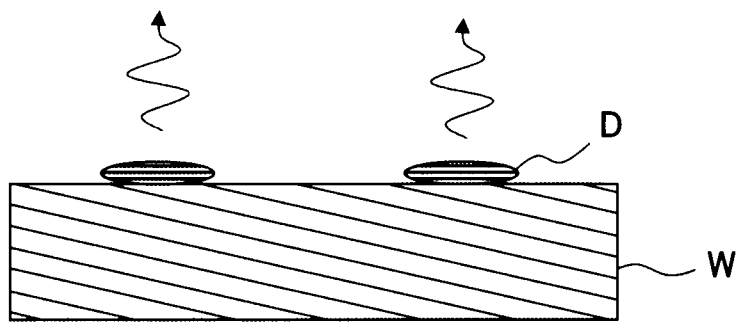
FIG. 9D illustrates part of the process through which particles are formed on the wafer having undergone the etching process.

A few days later, the salt B will have become deliquesced in the water ($H_2O$) in the atmosphere and thus will have coagulated. If particles C contain, for instance, $SiO_2$, a residue D of $SiO_2$ will remain on the wafer W after the particles C evaporate as shown in FIG. 9D. It is to be noted that the particles C with no $SiO_2$ content will evaporate and disappear without leaving any residue.

In addition to the issue discussed above, there is a concern arising when a silylating gas containing ammonia is used as the restoration processing gas. Namely, as the wafer W is etched with $CF_4$ gas, the wiring groove 580 is formed as a recessed area in the low-k film 540, as shown in FIG. 6. Through the etching process, the surface of the metal layer 522 becomes exposed at the bottom of the wiring groove 580. A very small amount of fluorine (CF) in the $CF_4$ gas may remain at the exposed surface of the metal layer 522. As the restoration process is subsequently executed on the wafer W with a restoration processing gas containing ammonia, the fluorine and the ammonia may react with each other, resulting in the formation of $NH_4F$ (solid substance) at the exposed surface of the metal layer 522. If a wiring metal such as copper is embedded in the wiring groove 580 in this state, the presence of $NH_4F$ at the connecting area where the wiring metal and the metal layer 520 connect with each other will increase the electrical resistance over the connecting area.

The β-diketone compound-containing gas, such as DPM gas or acetylacetone gas, used in the restoration process in the embodiment does not contain any ammonia, and thus, even if a very small amount of fluorine is present at the exposed surface of the wafer W, $NH_4F$, $(NH_2)_4SiF_6$ or the like is not formed. Consequently, the formation of particles is prevented and the electrical resistance over the area where the wiring metal and the metal layer 522 connect with each other is kept at a low level, thereby assuring desirable electrical characteristics in the multilayer wiring structure.

It is to be noted that since the wafer W is allowed to sustain relatively high temperature (e.g., 250° C.) during the restoration process in the embodiment, any residual water 544 in the low-k film 540 can be removed during the restoration process.

Once the restoration process executed in step S160 ends, the wafer W is carried out of the processing chamber 220C via the processing unit-side transfer mechanism 250 installed in the common transfer chamber 210 and is carried into either the first loadlock chamber 230M or the second loadlock chamber 230N, e.g., the second loadlock chamber 230N. The wafer W carried into the second loadlock chamber 230N is then taken back into the initial cassette container 102 via the transfer unit-side transfer mechanism 320. The sequence of wafer processing in the embodiment thus ends. The wafer W taken back into the cassette container 102 is subsequently transferred to another substrate processing apparatus (not shown) to undergo a specific process, e.g., a copper embedding process through which a wiring metal such as copper is embedded into the wiring groove 580 formed in the low-k film 540.

As described above, the wafer processing in the embodiment is executed by using, as a restoration processing gas, a β-diketone compound-containing gas (e.g., DPM gas or acetylacetone gas) containing a β-diketone compound with an ignition point higher than those of silylating gases used in the related art. Thus, both the ashing process and the restoration process can be executed in succession on the wafer W in the processing chamber 220C structured to function as the post processing chamber 400. As a result, the throughput of the substrate processing apparatus 100 is improved.

In addition, by adopting the embodiment, the film quality of the low-k film 540 having been damaged during the etching process or the ashing process can be restored to a desirable condition and the damaged area can be rendered into a sufficiently hydrophobic state.

The results of tests conducted to verify the advantages achieved by executing the restoration process in the embodiment are now described. In the tests, test wafers were each carried into an etching process chamber and the low-k film on the wafer was etched in a specific pattern. The test wafer was then transferred from the etching process chamber to the post processing chamber 400 where it underwent an ashing process to remove the etching mask. The restoration process and the ashing process were executed in succession in the same post processing chamber 400 by using a DPM gas as the restoration processing gas. In addition, in order to verify the relationship between the temperature of the test wafer undergoing the restoration process and the extent of restoration of the low-k film, the restoration process was executed by adjusting the test wafer temperature to 150° C., 200° C. and 250° C.

Figure 10:
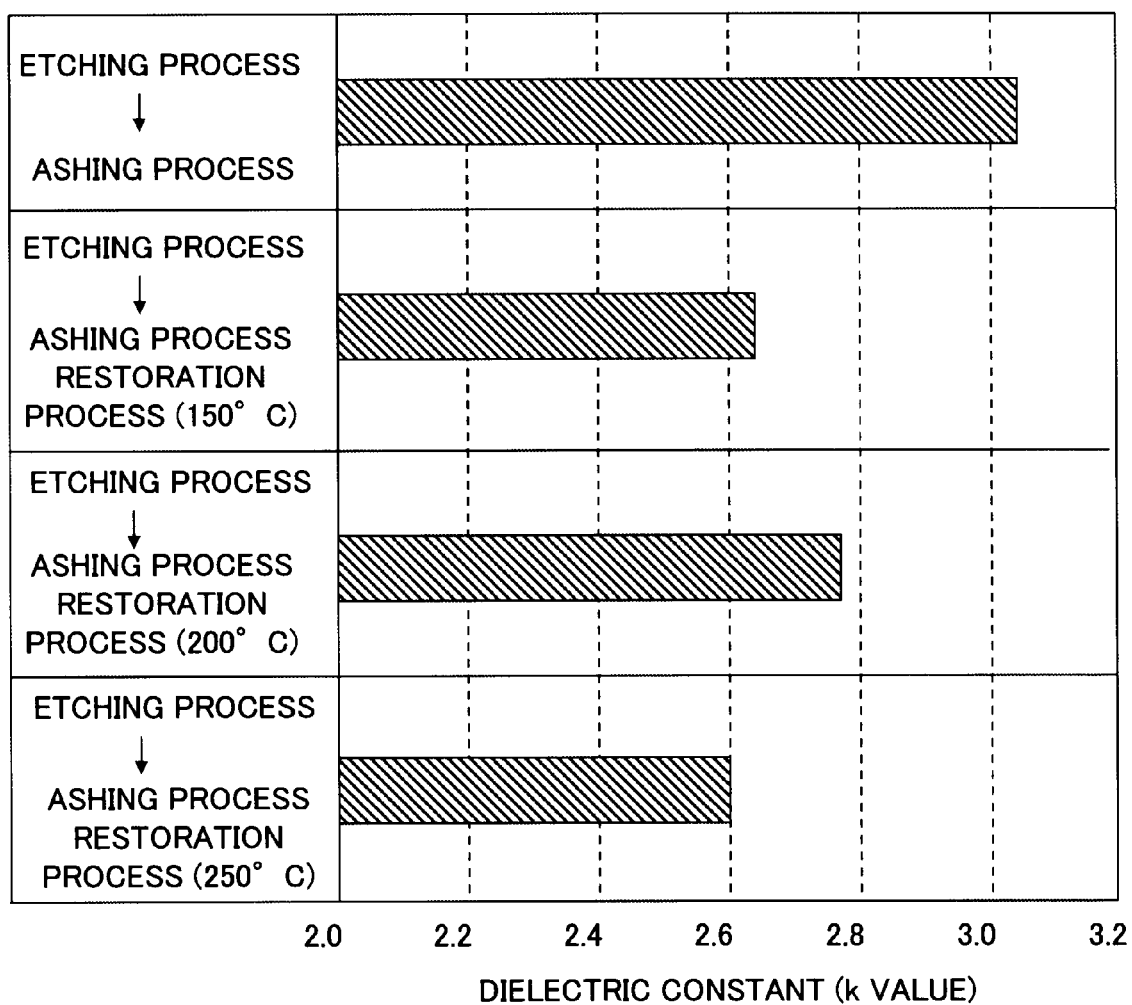
FIG. 10 is a graph presenting the results obtained by measuring the dielectric constant of the low-k film formed on test wafers having undergone the etching process, the ashing process and the restoration process.

The results of the tests conducted to verify that the film quality of the low-k film 540 is restored through the restoration process in the embodiment, i.e., that the dielectric constant is recovered to a desirable level, are first described. The decision as to whether or not the film quality of the low-k film 540 has been restored may be made by, for instance, measuring the dielectric constant of the low-k film 540 both before and after the restoration process. FIG. 10 presents the results obtained by measuring the dielectric constant (k value) of the low-k film. It is to be noted that the dielectric constant of the low-k film used in the tests was 2.38 prior to the etching process.

As FIG. 10 indicates, the dielectric constant of the low-k film on the test wafer W having undergone the etching process and the ashing process but not yet the restoration process increased to a level exceeding 3.0 from the pre-etching process value of 2.38, indicating that the film quality had degraded significantly. With the DPM gas supplied as the restoration processing gas to the low-k film with the undesirably high dielectric constant, the film quality was restored with the dielectric constant lowered to a level below 2.8, regardless of the temperature of the wafer W undergoing the restoration process, 150° C., 200° C. or 250° C. In particular, the film quality was restored to a more significant extent through the restoration process with the dielectric constant lowered to 2.6, when the temperature of the wafer W was set at 250° C.

Figure 11:
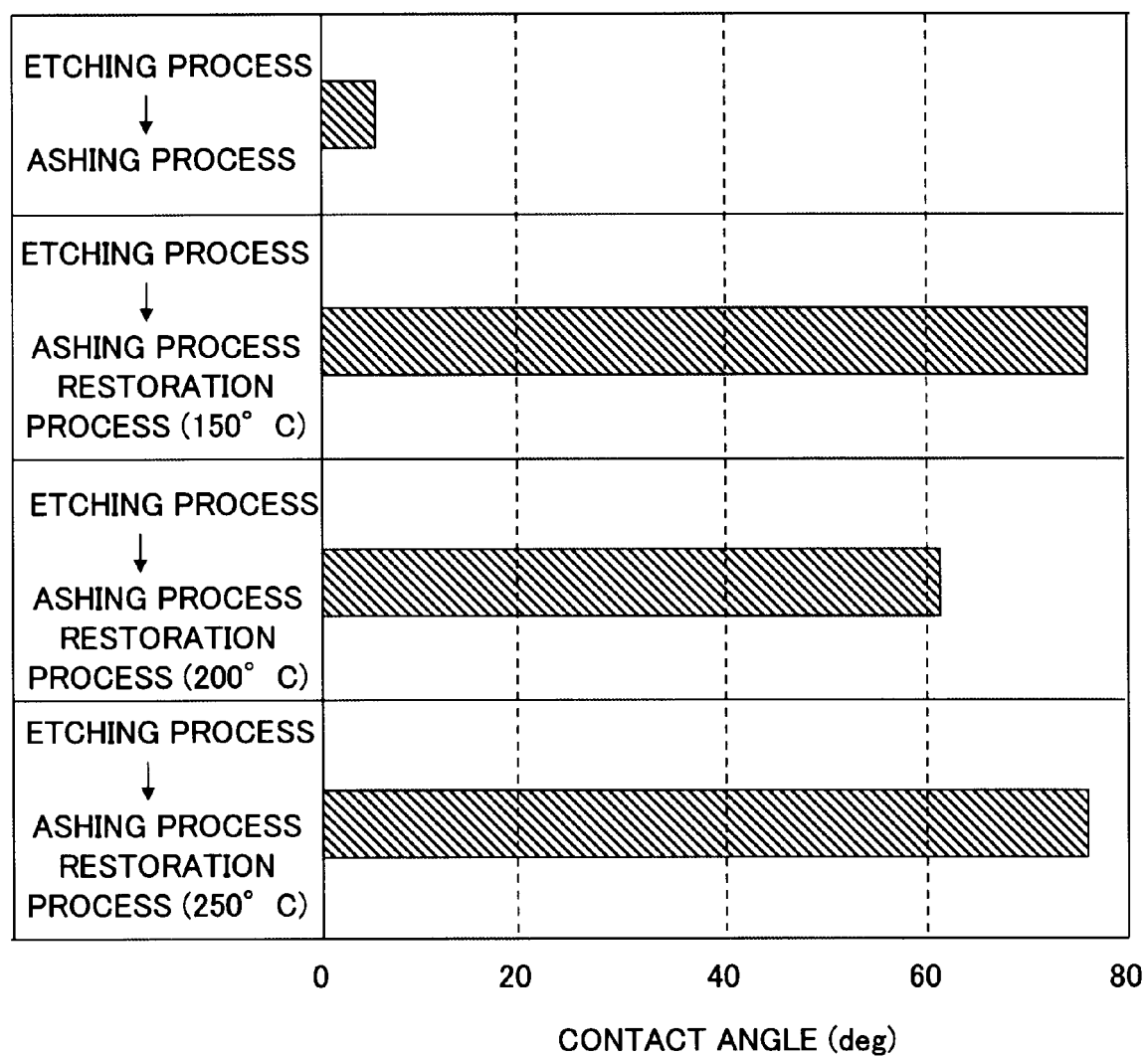
FIG. 11 is a graph presenting the results obtained by measuring the contact angle of a liquid dropped onto the low-k film formed on test wafers having undergone the etching process, the ashing process and the restoration process.

Next, the results of tests conducted to verify that the damaged area of the low-k film 540 is rendered into a sufficiently hydrophobic state through the restoration process in the embodiment are described. This verification may be executed by measuring the contact angle of the low-k film both before and after the restoration process. FIG. 11 presents a graph indicating such measurement results. In the test, a liquid such as water was dropped onto the surface of the low-k film and the angle (contact angle) formed by the tangential line of the liquid droplet and the surface of the low-k film was measured. If the low-k film had a higher level of hydrophobicity, the droplet on the film would assume a more spherical shape due to its own surface tension and thus the contact angle would be larger. More specifically, the level of hydrophobicity of the low-k film would be judged to be higher when the contact angle was closer to 90°, whereas the level of hydrophilicity of the low-k film would be judged to be higher (the level of its hydrophobicity judged to be lower) when the contact angle was closer to 0°.

As shown in FIG. 11, the contact angle of the low-k film on the test wafer W having undergone the etching process and the ashing process but not yet the restoration process was less than 10°. The hydrophobicity of the low-k film in this state would be very low and water would be readily absorbed into the low-k film. With the DPM gas supplied as the restoration processing gas to the low-k film with the lowered hydrophobicity, the contact angle was increased significantly to values above 60°, indicating an improvement in the hydrophobicity of the low-k film, regardless of the temperature of the wafer W undergoing the restoration process, 150° C., 200° C. or 250° C.

As the test results described above illustrate, the film quality of the low-k film having been damaged during the etching process can be restored to good condition through a restoration process executed by using a β-diketone compound-containing gas such as DPM gas or acetylacetone gas, so as to assure better electrical characteristics and mechanical characteristics over the related art. This, in turn, makes it possible to form semiconductor devices with desirable characteristics on wafers.

It is to be noted that while an explanation is given above in reference to the embodiment on an example in which the substrate processing apparatus 100 includes four etching process chambers and two post processing chambers 400, the present invention is not limited to this example and the numbers of the two types of processing chambers are adjustable. In addition, it is not essential that the substrate processing apparatus 100 include etching process chambers, and instead, the substrate processing apparatus 100 may include a post processing chamber 400 alone. In such a case, the etching process may be executed in a separate substrate processing apparatus.

Furthermore, while the wafer W undergoing the processing in the embodiment includes the anti-reflection coating 560 formed thereupon, such an anti-reflection coating 560 is not an essential requirement of the present invention. In addition, while the embodiment of the present invention has been explained in reference to an example in which the processing target substrate is a semiconductor wafer, the present invention is not limited to this example and it may be adopted in conjunction with another type of substrate.

It is obvious that the present invention may be achieved by providing a system or an apparatus with a medium such as a storage medium having stored therein a software program for realizing the functions of the embodiment described above and enabling a computer (a CPU or an MPU) in the system or the apparatus to read out and execute the program stored in the medium such as a storage medium.

The functions of the embodiment described above are achieved in the program itself, read out from the medium such as a storage medium, whereas the present invention is embodied in the medium such as a storage medium having the program stored therein. The medium such as a storage medium in which the program is provided may be, for instance, a flexible disk, a hard disk, an optical disk, a magneto-optical disk, a CD-ROM, a CD-R, a CD-RW, a DVD-ROM, a DVD-RAM, a DVD-RW, a DVD+RW, magnetic tape, a nonvolatile memory card or a ROM, or the program may be download to a storage medium via a network.

It is to be noted that the scope of the present invention includes an application in which an OS or the like operating on a computer executes the actual processing in part or in whole in response to the instructions in the program read out by the computer and the functions of the embodiment are achieved through the processing thus executed, as well as an application in which the functions of the embodiments are achieved as the computer executes the program it has read out.

The scope of the present invention further includes an application in which the program read out from the medium such as a storage medium is first written into a memory in a function expansion board loaded in a computer or a function expansion unit connected to the computer, a CPU or the like in the function expansion board or the function expansion unit executes the actual processing in part or in whole in response to the instructions in the program and the functions of the embodiment described above are achieved through the processing.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

What is claimed is:

1. A substrate processing method adopted when executing processing on a processing target substrate that includes a low dielectric constant insulating film, an etching mask formed on said low dielectric constant insulating film and a recessed portion formed by etching with said etching mask, the recessed portion having a dielectric constant which is increased from an initial value of said low dielectric constant insulating film before said etching, the method comprising:

an ashing process step in which the processing target substrate is heated to sustain a predetermined temperature, and said etching mask is removed through ashing with hydrogen radicals delivered to said processing target substrate; and a restoration process step in which an area of said low dielectric constant insulating film exposed at said recessed portion, having been rendered hydrophobic and having an increased dielectric constant value induced by said etching, is restored such that the dielectric constant of the area is decreased toward said initial value with a β-diketone compound-containing gas that contains a β-diketone compound with an ignition point equal to or higher than 300° C. that is delivered to said processing target substrate having undergone said ashing process, wherein said ashing process and said restoration process are executed within a single processing chamber.

2. A substrate processing method according to claim 1, further comprising measuring the temperature of said processing target substrate following said ashing process step, wherein:

said restoration process is executed immediately, if the measured temperature of said processing target substrate is lower than a predetermined temperature set within a range lower than the ignition point of the gas used in said restoration process; and said restoration process is executed only after said processing target substrate is cooled to a temperature lower than said predetermined temperature, if the temperature of said processing target substrate is equal to or higher than said predetermined temperature.

3. A substrate processing method according to claim 1, wherein said β-diketone compound is dipivaloylmethane (DPM) or acetylacetone.

* * * * *